(12) United States Patent
Gaur et al.

(10) Patent No.: US 12,028,094 B2
(45) Date of Patent: Jul. 2, 2024

(54) APPLICATION PROGRAMMING INTERFACE FOR FINE GRAINED LOW LATENCY DECOMPRESSION WITHIN PROCESSOR CORE

(71) Applicant: Intel Corporation, Santa Clara, CA (US)

(72) Inventors: Jayesh Gaur, Bangalore (IN); Adarsh Chauhan, Bangalore (IN); Vinodh Gopal, Westborough, MA (US); Vedvyas Shanbhogue, Austin, TX (US); Sreenivas Subramoney, Bangalore (IN); Wajdi Feghali, Boston, MA (US)

(73) Assignee: Intel Corporation

( * ) Notice: Subject to any disclaimer, the term of this patent is extended or adjusted under 35 U.S.C. 154(b) by 561 days.

(21) Appl. No.: 17/133,622

(22) Filed: Dec. 23, 2020

(65) Prior Publication Data
US 2022/0197659 A1 Jun. 23, 2022

(51) Int. Cl.
*H03M 7/00* (2006.01)
*G06F 9/38* (2018.01)
(Continued)

(52) U.S. Cl.
CPC ........ *H03M 7/6029* (2013.01); *G06F 9/3877* (2013.01); *G06F 9/541* (2013.01)

(58) Field of Classification Search
CPC ..... H03M 7/6029; H03M 7/60; G06F 9/3877; G06F 9/541
(Continued)

(56) References Cited

U.S. PATENT DOCUMENTS

| 6,049,866 A | 4/2000 | Earl |
| 6,208,273 B1 | 3/2001 | Dye et al. |
| (Continued) | | |

FOREIGN PATENT DOCUMENTS

| CN | 103810297 A | 5/2014 |
| CN | 114661227 A | 6/2022 |
| (Continued) | | |

OTHER PUBLICATIONS

Extended European Search Report dated Mar. 1, 2022 for EP Application No. 21198841.5.
(Continued)

*Primary Examiner* — Peguy Jean Pierre
(74) *Attorney, Agent, or Firm* — Spectrum IP Law Group LLC

(57) ABSTRACT

Methods and apparatus relating to an Application Programming Interface (API) for fine grained low latency decompression within a processor core are described. In an embodiment, a decompression Application Programming Interface (API) receives an input handle to a data object. The data object includes compressed data and metadata. Decompression Engine (DE) circuitry decompresses the compressed data to generate uncompressed data. The DE circuitry decompress the compressed data in response to invocation of a decompression instruction by the decompression API. The metadata comprises a first operand to indicate a location of the compressed data, a second operand to indicate a size of the compressed data, a third operand to indicate a location to which decompressed data by the DE circuitry is to be stored, and a fourth operand to indicate a size of the decompressed data. Other embodiments are also disclosed and claimed.

24 Claims, 13 Drawing Sheets

(51) Int. Cl.
*G06F 9/54* (2006.01)
*H03M 7/30* (2006.01)

(58) Field of Classification Search
USPC .......................................... 341/50, 67, 63, 51
See application file for complete search history.

(56) References Cited

U.S. PATENT DOCUMENTS

| | | | |
|---|---|---|---|
| 6,879,266 | B1 | 4/2005 | Dye et al. |
| 8,447,948 | B1 | 5/2013 | Erdogan et al. |
| 8,738,860 | B1 | 5/2014 | Griffin et al. |
| 10,331,558 | B2 | 6/2019 | Sazegari et al. |
| 2002/0124142 | A1 | 9/2002 | Har et al. |
| 2005/0160234 | A1 | 7/2005 | Newburn et al. |
| 2005/0289300 | A1 | 12/2005 | Kim et al. |
| 2013/0111605 | A1 | 5/2013 | Maeda et al. |
| 2014/0281240 | A1 | 9/2014 | Willhalm |
| 2014/0317377 | A1 | 10/2014 | Ould-Ahmed-Vall et al. |
| 2015/0178202 | A1 | 6/2015 | Sankaran et al. |
| 2015/0178214 | A1 | 6/2015 | Alameldeen et al. |
| 2015/0378731 | A1 | 12/2015 | Lai et al. |
| 2016/0179676 | A1 | 6/2016 | Engh-Halstvedt et al. |
| 2016/0321076 | A1 | 11/2016 | Satpathy et al. |
| 2018/0011796 | A1* | 1/2018 | Guilford .................. H03M 7/30 |
| 2019/0034335 | A1 | 1/2019 | Torre et al. |
| 2019/0042354 | A1 | 2/2019 | Coquerel et al. |
| 2019/0034333 | A1 | 6/2019 | Sazegari et al. |
| 2020/0190807 | A1 | 6/2020 | Header |
| 2021/0035258 | A1 | 2/2021 | Ray et al. |
| 2021/0103550 | A1 | 4/2021 | Appu et al. |
| 2021/0114495 | A1 | 4/2021 | Battaglia et al. |
| 2021/0312697 | A1 | 10/2021 | Maiyuran et al. |
| 2021/0374897 | A1 | 12/2021 | Ray et al. |
| 2022/0066931 | A1 | 3/2022 | Ray et al. |
| 2022/0197643 | A1* | 6/2022 | Gaur ................... G06F 12/0886 |
| 2022/0197659 | A1 | 6/2022 | Gaur et al. |
| 2022/0197799 | A1 | 6/2022 | Gaur et al. |
| 2022/0197813 | A1 | 6/2022 | Gaur et al. |

FOREIGN PATENT DOCUMENTS

| | | |
|---|---|---|
| CN | 114661359 A | 6/2022 |
| CN | 114661625 A | 6/2022 |
| CN | 115793960 A | 3/2023 |
| EP | 4020185 A1 | 6/2022 |
| EP | 4020223 A1 | 6/2022 |
| EP | 4020230 A1 | 6/2022 |
| EP | 4020231 A1 | 6/2022 |
| EP | 4149008 A1 | 3/2023 |
| JP | H0922353 A | 1/1997 |
| WO | 2020190807 A1 | 9/2020 |
| WO | 2020190799 A3 | 10/2020 |

OTHER PUBLICATIONS

Colyer, Adrian, "Software-defined far memory in warehouse scale computers," The Morning Paper, 13 pages, May 22, 2019.
European Examination Report, application No. 21198874.6, dated Oct. 23, 2023, 7 pages.
Extended European Search Report for application No. 22188197. 2-1224, dated Feb. 3, 2023, 10 pages.
Lagar-Cavilla, Andres, et al. "Software-Defined Far Memory in Warehouse-Scale Computers," Session: VM/Memory, ASPLOS '19, Apr. 13-17, 2019, Providence, Rhode Island, pp. 317-330.
Zswap, The Linux Kernel documentation, Linux Memory Management Documentation, retrieved from www.kernel.org/doc/html/latest/vm/zswap.html on Aug. 29, 2021.
European Patent Office, Notice of Grant for Application No. 21198841. 5, dated Dec. 14, 2023, 80 pages.
Extended European Search Report dated Mar. 1, 2022 for EP Application No. 2119770.4.
Extended European Search Report dated Mar. 16, 2022 for EP Application No. 21198874.6.
Examination report issued by the European Patent Office for Application No. 21198874.6-1203, dated Jan. 19, 2023, 6 pages.
Extended European Search Report dated Apr. 7, 2022 for EP Application No. 21198710.2.
Lagar-Cavilla et al. "Software-Defined Far Memory in Warehouse-Scale Computers," ASPLOS 2019, retrieved from https://blog.acolyer.org/2019/05/22/sw-far-memory/ on Nov. 19, 2020, 11 pages.
Abail et al. "Data Compression Accelerator on IBM Power9 and z15 Processors," ISCA 2020, 14 pages.
Cao et al. "Characterizing, Modeling, and Benchmarking RocksDB Key-Value Workloads at Facebook," FAST 2020, retrieved from https://blog.acolyer.org/2020/03/11/rocks-db-at-facebook/ on Nov. 19, 2020, 12 pages.
Non-final Office Action issued in U.S. Appl. No. 17/133,615 dated Feb. 15, 2024, 16 pages.
Decision to grant European patent for Application No. 21198841.5, Apr. 5, 2024, 2 pages.

* cited by examiner

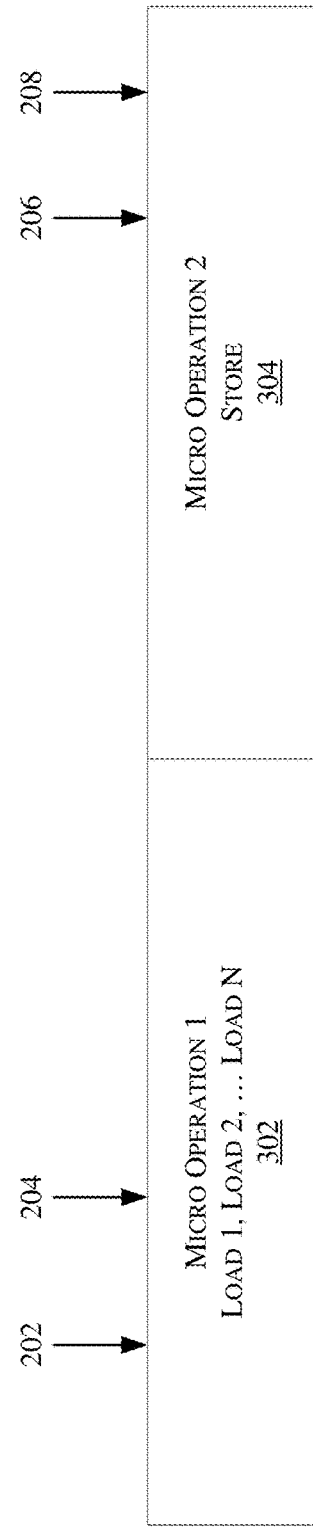

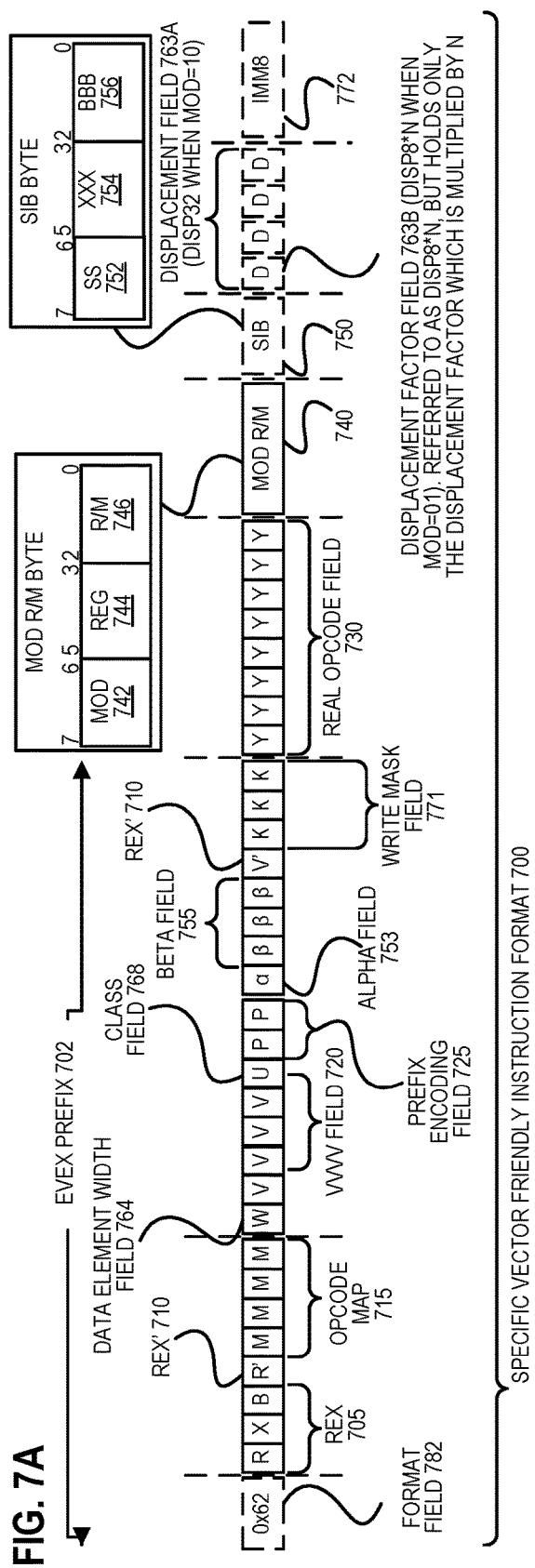
FIG. 7A
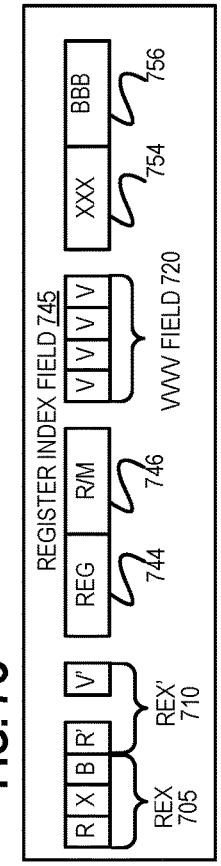
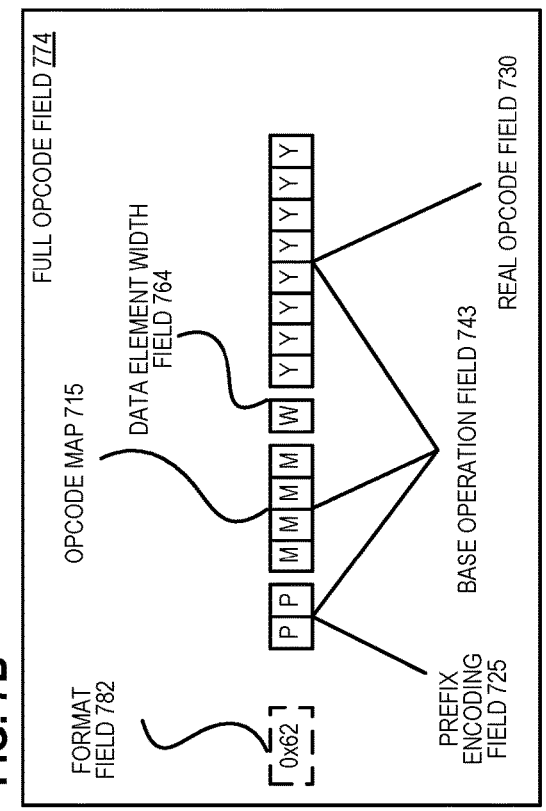
FIG. 7B
FIG. 7C

APPLICATION PROGRAMMING INTERFACE FOR FINE GRAINED LOW LATENCY DECOMPRESSION WITHIN PROCESSOR CORE

FIELD

The present disclosure generally relates to the field of electronics. More particularly, some embodiments relate to an Application Programming Interface (API) for fine grained low latency decompression within a processor core.

BACKGROUND

Generally, Dynamic Random Access Memory (DRAM) and/or interconnect bandwidth limitations can be a major performance bottleneck for present Central Processing Unit (CPU) cores. These bandwidth limitations cause delays in data transfer to and from CPU cores. Hence, if DRAM and/or interconnect bandwidth limitations are reduced or eliminated, CPU performance can be greatly increased.

BRIEF DESCRIPTION OF THE DRAWINGS

So that the manner in which the herein recited features of the present embodiments can be understood in detail, a more particular description of the embodiments may be had by reference to embodiments, some of which are illustrated in the appended drawings. It is to be noted, however, that the appended drawings illustrate only typical embodiments and are therefore not to be considered limiting of their scope.

FIG. 2 illustrates sample operands for a decompression instruction, according to an embodiment.

FIG. 3 illustrates two sample decoded operations for a decompression instruction, according to an embodiment.

FIG. 7A is a block diagram illustrating an exemplary instruction format according to embodiments.

FIG. 7B is a block diagram illustrating the fields of the instruction format that make up the full opcode field according to one embodiment.

FIG. 7C is a block diagram illustrating the fields of the instruction format that make up the register index field according to one embodiment.

DETAILED DESCRIPTION

Figure 1:
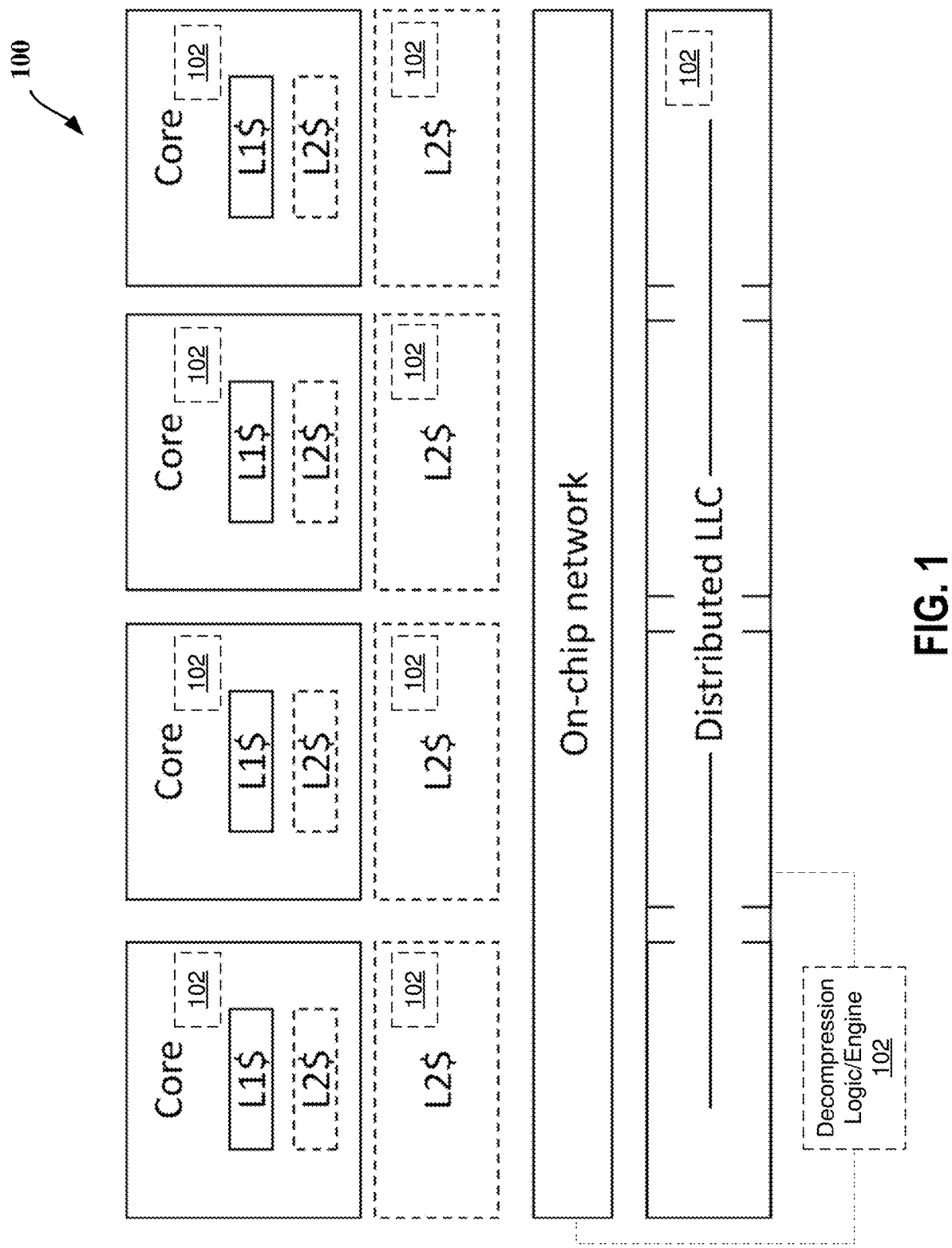
FIG. 1 illustrates a block diagram of a processor with private cache level and a shared last-level cache, which may be utilized in some embodiments.

In the following description, numerous specific details are set forth in order to provide a thorough understanding of various embodiments. However, various embodiments may be practiced without the specific details. In other instances, well-known methods, procedures, components, and circuits have not been described in detail so as not to obscure the particular embodiments. Further, various aspects of embodiments may be performed using various means, such as integrated semiconductor circuits ("hardware"), computer-readable instructions organized into one or more programs ("software"), or some combination of hardware and software. For the purposes of this disclosure reference to "logic" shall mean either hardware, software, firmware, or some combination thereof.

As mentioned above, performance of present processor or Central Processing Unit (CPU) cores is significantly limited by Dynamic Random Access Memory (DRAM) and/or interconnect bandwidth. To scale up DRAM or interconnect bandwidth, one effective way is to reduce the amount of data transferred to and from the cores using compression and decompression. However, large compression/decompression latency can limit the efficacy of such a solution even when using accelerators to speed up the compression/decompression.

To this end, some embodiments provide techniques relating to an Application Programming Interface (API) for fine grained low latency decompression within a processor core. In an embodiment, a decompression Application Programming Interface (API) receives an input handle to a data object. The data object includes compressed data and metadata. In an embodiment, the metadata remains uncompressed to assist in identifying the compressed portion for decompression. Decompression Engine (DE) circuitry decompresses the compressed data to generate uncompressed data. The DE circuitry decompresses the compressed data in response to invocation of a decompression instruction (or DISA) by the decompression API.

Further, at least one embodiment provides an instruction and/or micro-architecture support for decompression on a processor or CPU core. This ISA extension may also be referred to as Decompression ISA or "DISA" herein. One or more embodiments provide a hardware-software synergistic solution that proposes a low latency decompression solution at hardware level for an end-to-end compression/decompression solution. In at least one embodiment, the utilized instruction(s) follow the EVEX format (such as discussed with reference to FIGS. 7A-7C. However, embodiments are not limited to EVEX format and any instruction format may be used to implement various embodiments.

Various embodiments provide bandwidth benefits to and from a processor core, thereby reducing pressure on not just DRAM but also on the interconnect coupled between various components of a processor including one or more cores, memory, etc. An embodiment includes a decompression accelerator and architecturally enables the decompression accelerator in a processor core's Level 2 (L2) cache (which may also be interchangeably referred to as mid-level cache or "MLC"). At least one embodiment causes signaling a processor core after decompressing every cache-line (e.g., 64B, where "B" refers to Byte or Bytes) of data. This is in contrast with some approaches which may wait for a complete chunk of data (such as a page or 4 KB) to be decompressed before allowing consumption of or access to the decompressed data, thereby entailing significant latency penalty.

Moreover, one or more embodiments also allow speculative decompression of data, permitting the large depth of out-of-order cores to absorb the expensive decompression latency, e.g., by allowing the out-of-order decompression of data instead of sequential decompression. Generally, to improve performance, some processors utilize speculative processing (also sometimes referred to as Out-Of-Order (OOO) processors), which executes a program in parallel and sooner than a sequential process would follow. The speculative processing may or may not end up being correct. When it is correct, a program will execute in less time than when non-speculative processing is employed, thereby improving performance and reducing latency. Furthermore, a new instruction in the ISA is utilized to enable a core to communicate with the decompression accelerator in an embodiment.

By contrast, some implementations may rely on compression/decompression to be performed completely in software to enhance effective memory capacity. However, software-only decompression is slow and costly. Additionally, a hardware accelerator may be used for compression and decompression of data stored far away from a core. However, hardware decompression accelerators operate on large chunks of data. This is generally done to amortize the large latency of communication given the large distance that these accelerators sit away from the cores. Such coarse-granular decompression is not very useful or efficient for applications that need to work with many smaller objects.

On the other hand, the decompression accelerator proposed as part of this disclosure is located at or near the L2 cache of the cores (i.e., closer to the cores). This enables fast communication between the core and the accelerator through a dedicated instruction. The accelerator can thus be designed to signal/inform the core on completion of decompression of every cacheline (e.g., every 64B) without having to wait for the rest of the chunk to be decompressed. The accelerator may signal the core by using a dedicated signal, a dedicated bus for signaling, a packet with completion information, or changing a status bit in a designated register or location in cache (such as L1 cache or L2 cache), etc. This signaling may also convey the address/location of the decompressed cacheline in the (e.g., L2) cache or may include the decompressed data. As a result, the core can make forward progress (enabling ILP) while decompression proceeds for subsequent cachelines of the larger block to be decompressed. Moreover, the decompression accelerator may be invoked speculatively. By invoking the accelerator speculatively, the latency of decompression can be hidden by the deep out-of-order windows of processors. These two approaches enable one or more embodiments to outperform current state-of-the-art, allowing fine grained decompression very close to the core(s).

Further, some embodiments may be applied in computing systems that include one or more processors (e.g., where the one or more processors may include one or more processor cores), such as those discussed with reference to FIG. 1 et seq., including for example a desktop computer, a work station, a computer server, a server blade, or a mobile computing device. The mobile computing device may include a smartphone, tablet, UMPC (Ultra-Mobile Personal Computer), laptop computer, Ultrabook™ computing device, wearable devices (such as a smart watch, smart ring, smart bracelet, or smart glasses), etc.

For example, FIG. 1 illustrates a block diagram of a processor 100 with private cache level and a shared last-level cache, which may be utilized in some embodiments. As shown, each core has a number of private cache levels (e.g., including a L1 and Level 2 (L2) cache levels (the L2 cache may sometimes be referred to as Mid-Level Cache (MLC)) which may be kept coherent, and a shared last-level cache (LLC), which may be distributed amongst a plurality of cores. The on-chip network may facilitate communication amongst the cores, L2 caches, and/or distributed LLC. A cache may sometimes be designated with a dollar sign ($), such as shown in FIG. 1. Generally, cache coherence is managed at cache block or cacheline granularity. Also, as shown in FIG. 1, a core may include L1 cache, whereas L2 cache may straddle the boundary and be implemented as part of the core or outside the core (as indicated by the dashed boxes indicating the optional placement of L2 cache). LLC is located outside the core as shown in FIG. 1 and shared amongst a plurality of processor cores.

A decompression logic circuitry/engine 102 may be provided in various locations in in the processor 100. In at least one embodiment, decompression logic 102 may be in a core, e.g., adjacent or near an L2 cache. However, embodiments are not limited to this and decompression logic 102 may be instead be outside the core, e.g., coupled to the on-chip network, distributed LLC or between the core and the on-chip network/distributed LLC.

In an embodiment, x86 ISA (provided by Intel® Corporation) is expanded to include a special hardware-decompression instruction. When a programmer wants to read or make use of the actual data which has been compressed, decompression is performed. Decompression is triggered when the processor executes the decompression instruction (DISA) which brings the compressed data into the core's cache(s), decompresses it using a hardware accelerator (i.e., decompression logic 102) that stores the decompressed data in the L2 cache (or another cache like LLC depending on the implementation and/or data size). The decompression operation is performed speculatively in an embodiment, and the processor/core continues to execute instructions that are not dependent on the decompressed data, thereby hiding the latency of decompression. Once the data requested by the core (e.g., one or more cachelines) is available in a decompressed state, the core can proceed and not wait for the complete decompression operation of all cachelines or chunk(s) of data to finish.

Hence, some embodiments allow processors to scale up the bandwidth of DRAM and/or interconnect, agnostic of the DRAM and/or interconnect technology or vendor used, and provide overall performance gains for processors by alleviating memory and/or interconnect bottlenecks. By effectively increasing DRAM and/or interconnect bandwidth (e.g., due to compression) along with the proposed low latency decompression, customers can help reduce the data center TCO (Total Cost of Ownership) for memory. Simulation results show up to 2×performance on bandwidth sensitive kernels, that are representative of data center use case scenarios, for instance. To this end, some embodiments address the memory bottlenecks limiting processor performance. Using data-compression in a hardware-software synergistic manner, applications can achieve an effectively lower memory bandwidth requirement.

To compress the data, applications identify their target data-structures and compress them using available compression algorithms such as DEFLATE. As discussed herein, "Deflate" or "DEFLATE" generally refers to a lossless data compression file format used in conjunction with compression coding, e.g., in accordance with Lempel-Ziv-Storer-Szymanski (LZSS) and/or Huffman coding. Compression may be in software or done with an offload engine. Generally, to minimize memory bandwidth requirements, compression will be performed on frequently used data. Reading frequently used data in a compressed form, will effectively reduce memory bandwidth requirements. However, decompression latency will now critically affect the performance. Moreover, server products are also limited by the interconnect bandwidth, so it is important to transfer compressed data over the interconnect and perform low latency decompression as close to the core as possible in accordance with some embodiments.

To achieve this, one embodiment uses a dedicated hardware accelerator (e.g., decompression logic 102) close to the core and performs low latency decompression. Using microarchitecture support in the pipeline of the core and a dedicated decompression engine at the L2-cache, DISA enables fine-grained, cacheline level access to the data being decompressed.

As discussed below, there are three independent flows in DISA as follows:

1. ISA Extension—This section explains the instruction semantics of the hardware-decompression engine and the ISA extensions to access it in software.

2. Software Support—This section illustrates how the compression and decompression steps are included in the application code (e.g., user space).

3. Hardware/Micro-architecture Support—This section explains how the core pipeline is modified to handle the decompression and how the final decompressed data is delivered to the consumer-instructions in the user program space. This section also explains the micro-architecture flows that enable decompression using additional hardware in the form of a decompression engine that implements the decompression function associated with the compression algorithm.

One aim of compression in this scenario is to provide bandwidth savings all the way to the core. This saves not just memory bandwidth but also network/interface bandwidth.

ISA Extension

FIG. 2 illustrates sample operands 200 for a decompression instruction, according to an embodiment. FIG. 3 illustrates two sample decoded operations for a decompression instruction, according to an embodiment. A special hardware-decompression instruction is used which is referred to herein as DISA for Decompression ISA henceforth. Its semantics are described as follows:

A. It can have at least four fields—1. Source (compressed) data location 202 (e.g., a virtual memory address); 2. Source-data size 204 (the software API (Application Programming Interface) providing compression can also provide the compressed-output size); 3. Destination 206 (decompressed) data location (e.g., a virtual memory address); 4. Destination data size 208 (stored in any of the available logical temporary registers).

B. It may have other variations like using a consumer bitmap. For example, when considering compression on a page-level granularity, then for a memory page of 4 KB and cache-line size of 64 bytes in the core, this bitmap can be 64 bits long signaling/indicating which index cachelines are of interest for the consumer instructions/code after decompression completes. Alternatively or in addition to the bitmap, a bit mask may be used to select cachelines for decompression and/or access. This approach could potentially improve cache space management, minimize evictions, etc.

Figure 9:
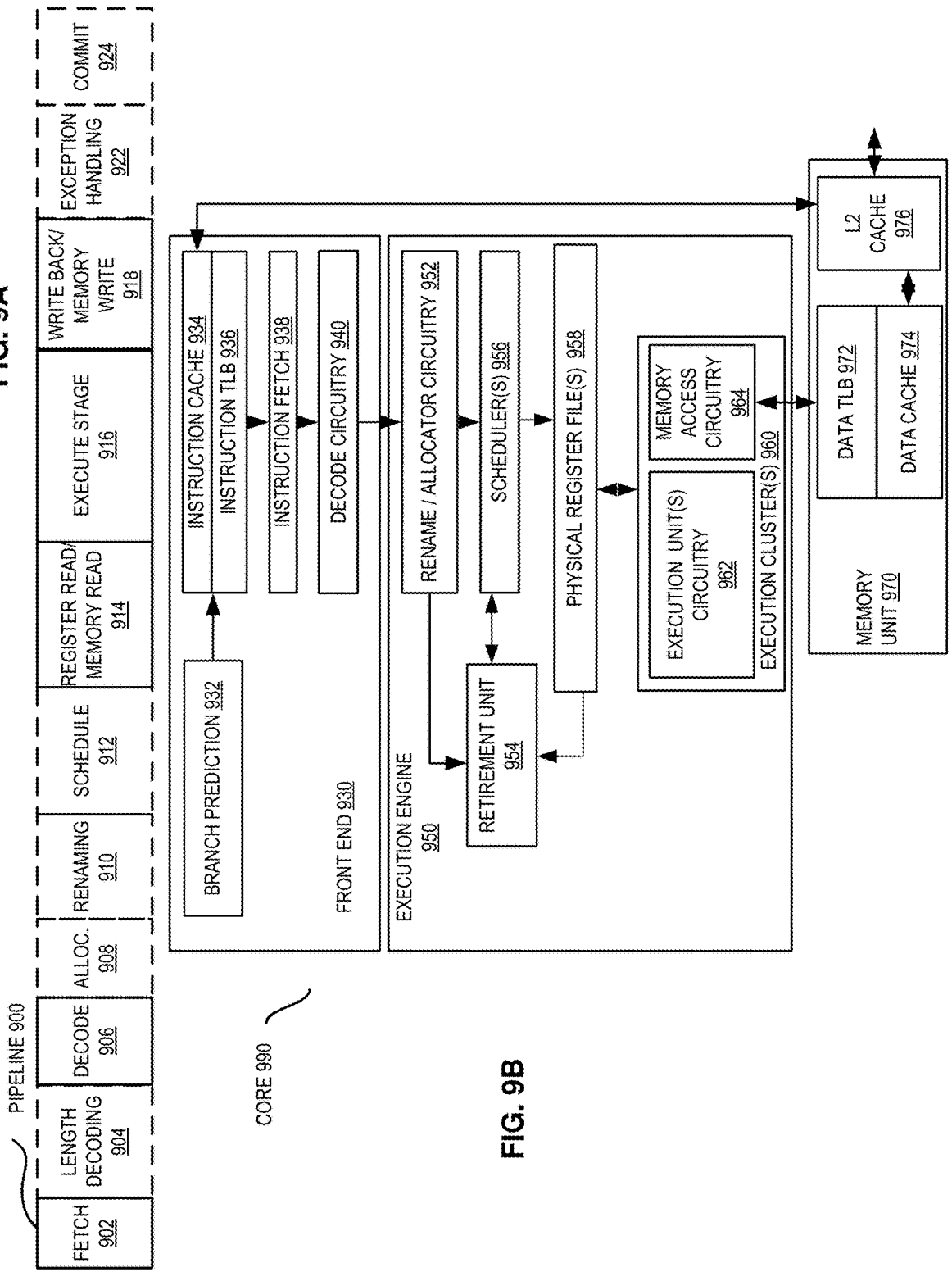
FIG. 9A is a block diagram illustrating both an exemplary in-order pipeline and an exemplary register renaming, out-of-order issue/execution pipeline according to embodiments.
FIG. 9B is a block diagram illustrating both an exemplary embodiment of an in-order architecture core and an exemplary register renaming, out-of-order issue/execution architecture core to be included in a processor according to embodiments.

C. After fetching and decoding by the processor's front-end (e.g., front end 930 of FIG. 9), DISA is split into two fused micro-operations (uops) as shown in FIG. 3. The first fused-uop 302 is a load operation which dispatches one or more loads for all the cachelines containing the compressed data to be decompressed. These load(s) access memory and fetch the required cachelines from the DRAM or main memory (such as memory 1060 of FIG. 10) to the core caches. The second fused-uop 304 is a store operation which may function as a macro-store that signals the decompression engine 102 to start and perform decompression. Unlike traditional stores which directly go to the memory/DRAM to bring to-be-written cachelines into the core's caches, some embodiments use a macro-store "DISA store" which causes the decompression engine 102 to produce the uncompressed data into the core's cachelines, e.g., as further discussed with reference to FIG. 4. As shown in FIG. 3, the load uop 302 may receive operands 202 and 204, while the store uop 304 may receive operands 206 and 208.

Additionally, in at least one embodiment, for ease of implementation, a four-operand instruction may be broken down into two or more instructions, as needed.

Software Support

Initially, it is decided (e.g., by a programmer, designer, and/or user) which data objects are large enough to benefit substantially from compression. Compressibility or achievable compression ratio may also be a factor that might go into this decision. The liveliness of the decompressed data, i.e., whether it needs to be decompressed and stored globally or is it a temporary variable that is alive as long as the function containing this data is alive on the program stack, may be another design choice. An embodiment is orthogonal and agnostic to these choices, simply operating on a target for decompression, while following the previously described architectural semantics. Also, one or more APIs discussed herein may be stored in any type of storage device such as those discussed with reference to FIG. 1 et seq., including for example a cache (such as an L1 cache, an L2 cache (like L2 426 of FIG. 4), an LLC, etc.).

One embodiments provides a public API imported into the program code as a static library. It consists of the compression function which implements a given or multiple compression algorithm(s) (like DEFLATE) and given the bytes of data for any size, compresses it in a programmer accessible object which contains the compressed data as well as other metadata used for later decompression. In an embodiment, the metadata remains uncompressed to assist in identifying the compressed portion for decompression. An example, which can serve as a template for the design of such an API and the corresponding invocation in the application of interest, is as follows:

```
// example of a large array of objects
  my_struct* user_data_array = (my_struct*) malloc
(sizeof(my_struct) * 1024 * 1024);
  initialize_data(user_data_array);
  ...
// example of an API (system) called to compress data in software
  COMPRESSED_DATA* compress_user_data(user_data_array, 1024
* 1024, sizeof(my_struct));
```

Here, "my_struct" is the type of custom data-structure in the example application which is the target of compression and "COMPRESSED_DATA" is a defined compressed-data structure/format that is recognized and used for decompression later on.

One embodiment provides handle(s) (sometimes referred to as pointer(s)) to the actual compressed data and information regarding how much of compressed data needs to be decompressed, which the defined data-structure will hold. As discussed above, a bitmap and/or a bit mask may be used to select specific cachelines for decompression and/or access.

Moreover, when accessing the original data belonging to user data array later on in the program (e.g., in a read-only manner), another API function may be used as follows:
(my_struct*) decompress_user_data (COMPRESSED_DATA*);
// decompress ISA or DISA will be called within this function (and potentially cached for serving multiple "structs" read from the same 4 KB page)

This API decompression-function corresponds to the hardware counterpart of DISA. It takes as an input handle to the compressed-data-object that is obtained before using the software API function. But instead of decompressing it in hardware like some software-based compression routines, the DISA hardware-decompression instruction may be used. Since the compressed-data-object also contains metadata related to compression, it will supply the three main arguments needed by the special ISA extended instruction, i.e., the virtual address location of the compressed data, the original (uncompressed) size of the data required, and the compressed data size obtained after compression. The final argument (parameter) which is the virtual address location of the decompressed data can either be explicitly and locally created by the programmer or by the API function definition in the program space at the point of calling this function.

Micro-Architecture Details

Figure 4:
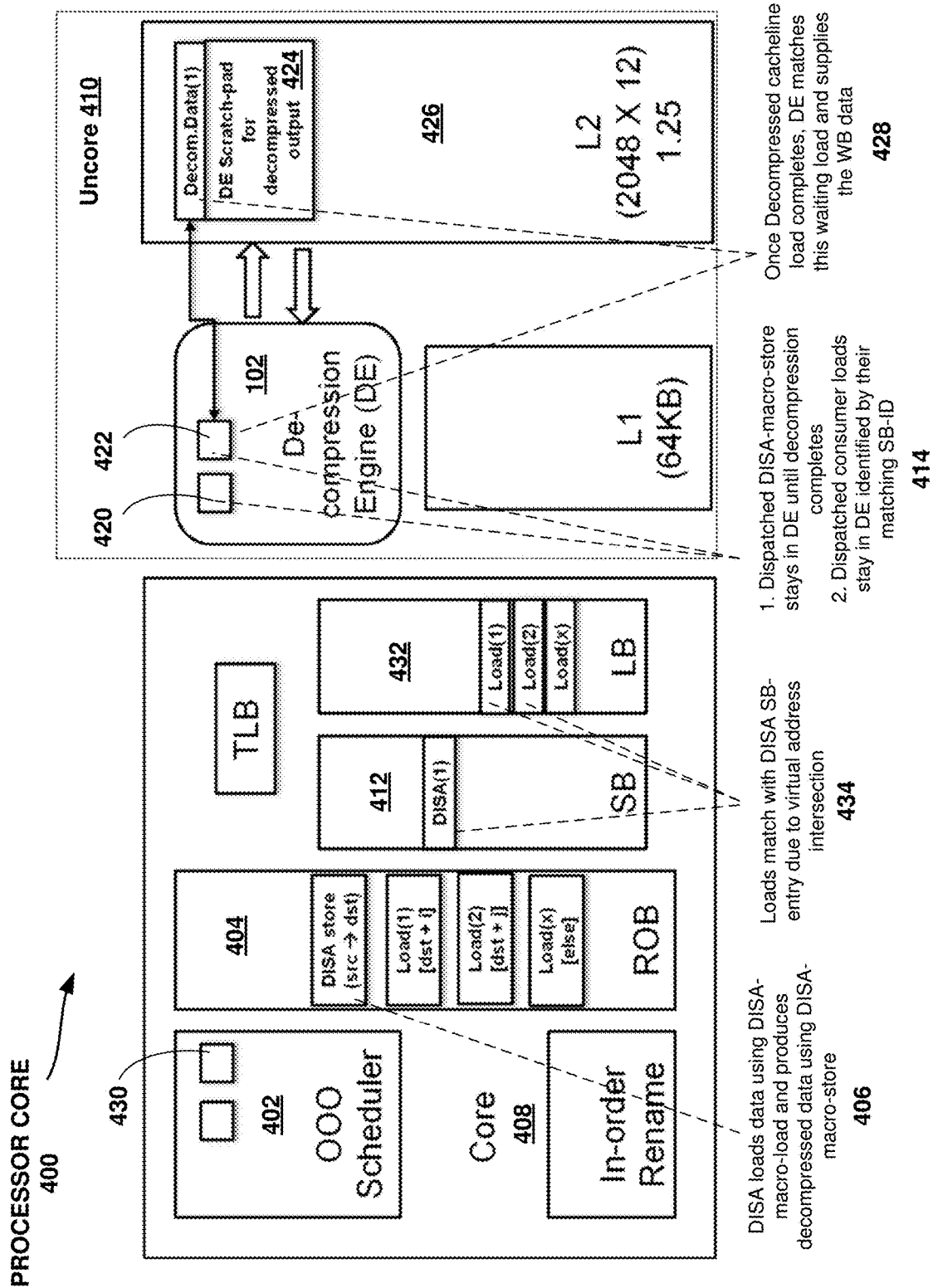
FIG. 4 illustrates a high level diagram of various components of a processor core, according to an embodiment.
Figure 5:
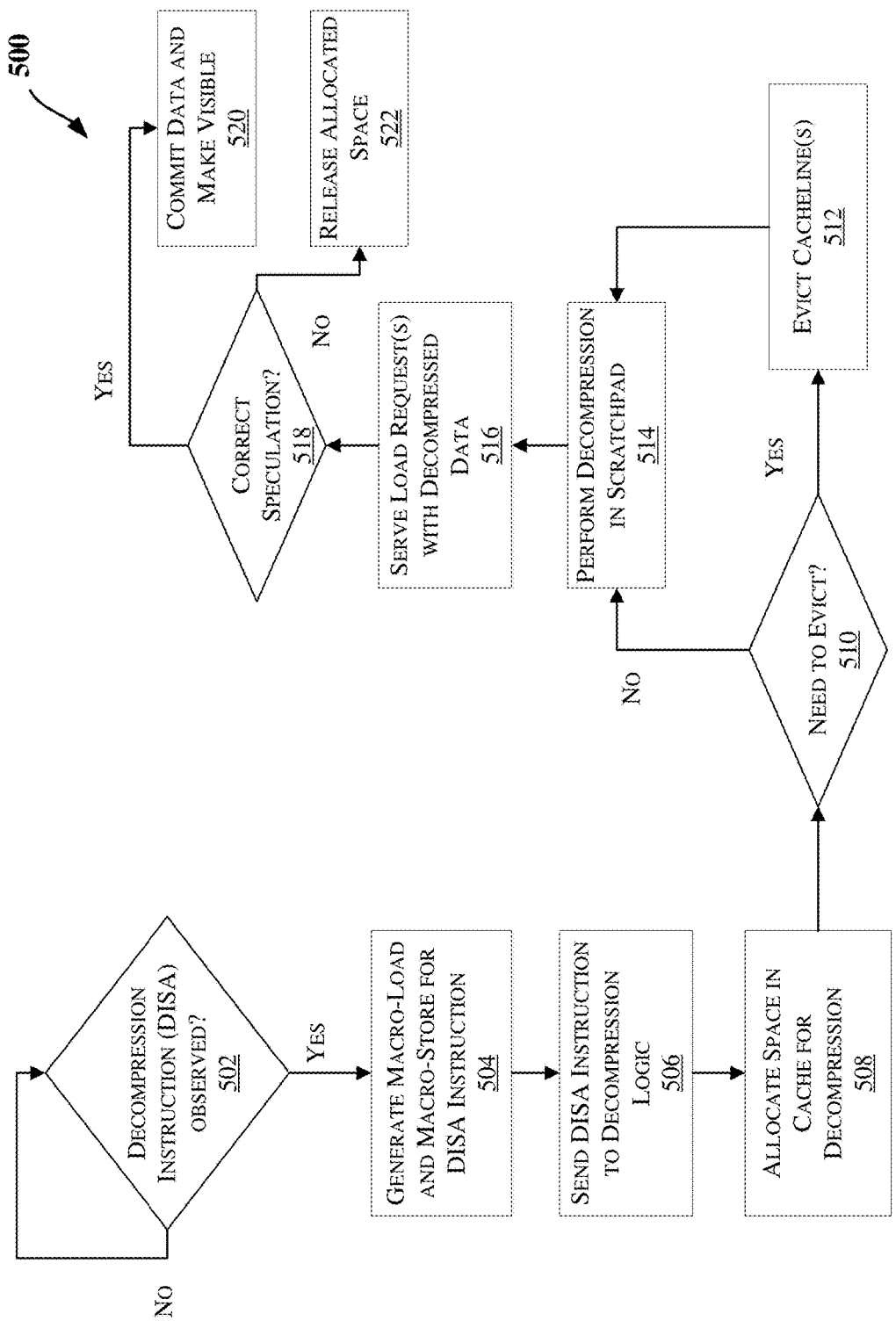
FIG. 5 illustrates a flow diagram of a method to provide decompression closer to a processor core, according to an embodiment.

FIG. 4 illustrates a high level diagram of various components of a processor core 400, according to an embodiment. FIG. 5 illustrates a flow diagram of a method 500 to provide decompression closer to a processor core, according to an embodiment. In one or more embodiments, operations of the method 500 may be performed by one of more hardware components of FIG. 4 as further discussed below.

Referring to FIG. 4, the modified application code using the above-mentioned API functions, and working with compressed data in the program space, executes on the processor core 400 with hardware support to provide decompression purely in hardware and decoupled from both the software and the Operating System (OS). For the purpose of explanation, it is assumed that the targeted uncompressed data fits within the default page size (commonly 4 KB in the normal cases today) in the DRAM or main memory (such as memory 1060 of FIG. 10). The application code consists of one or more load instructions which read the decompressed data after it has been decompressed and stored into the core's cache (e.g., L2 cache, L1, cache, and/or LLC cache).

Referring to FIGS. 4 and 5, operation 502 detects the DISA instruction (e.g., by core 408). As discussed in the above ISA Extension section, the fetching and decoding of DISA instruction will produce two fused uops in the OOO of the core (e.g., scheduled for execution by the OOO Scheduler 402—one fused uop for loading compressed data from the DRAM into the core's cache(s) in the Re-Order Buffer (ROB) 404 and the other for storing decompressed data back into the memory (cache/DRAM) for subsequent consumption. Operation 504 generates a macro load and a macro store operation for the DISA instruction and operation 506 sends the DISA instruction (or even a signal indicating the decompression request) to the DE 102. Operations 504 and 506 may be performed by components of core 408 as further discussed herein. The following operations may be used to handle the DISA-macro-load and DISA-macro-store to achieve decompression in hardware 406.

The DISA-macro-load is dispatched from the OOO scheduler 402 when its sources, e.g., the compressed data memory location and compressed data memory size, are available. It can be dispatched normally from the core 408 to the uncore 410 and may be broken down into multiple loads (such as Load(1), Load(2), . . . , Load(x) shown in ROB 404) during dispatch since compressed data may span multiple cachelines depending on the compressed data size. Since the OS is not aware of the compressed data format and it exists in the program space, it brings the corresponding cachelines—such as any data would be brought from the physical pages corresponding to the virtual memory location of compressed data—into cacheline chunks that the core can then store and process.

The DISA-macro-store may be allocated by the time DISA-macro-load is fetching data from memory. This allocation timing can provide bandwidth savings for delivering performance gains. DISA-macro-store proceeds to be dispatched to the uncore 410 from the Store Buffer (SB) 412 when all its sources, i.e., memory address for storing the decompressed data and the decompressed size, are available. DISA-macro-store 420, after being dispatched from SB 412, is trapped/kept by the Decompression Engine (DE) or logic 102 until decompression completes 414. Similarly dispatched consumer loads 422 stay in the DE 102 as identified by their matching SB identifier (ID) 414.

As shown in FIG. 4, decompression logic/engine 102 operates at L2 cache (216) level and uses its cachelines as its temporary storage or scratch-pad 424. Operation 508 of FIG. 5 allocates space in the (e.g., L2) cache for decompression purposes. For example, the DE 102 may reserve the requisite number of cachelines (e.g., depending on the decompressed data size) in L2 cache 426 and prevent them from being accessed, modified or evicted (e.g., by marking them as uncacheable) until decompression logic/engine 102 is done decompressing the compressed data. Operation 510 (e.g., performed by DE logic 102 and/or a cache controller or other logic coupled to the L2 cache 426 determines whether there is sufficient space for the decompression data, and if eviction is required, operation 512 evicts one or more cachelines from the L2 cache (e.g., based on a Least Recently Used (LRU) algorithm or another algorithm). Otherwise, if no eviction is required, DE logic 102 performs decompression in the allocated scratchpad 424 in the L2 cache.

Once the decompressed cacheline load is completed, DE 102 matches this waiting load(s) and supplies the Write Back (WB) data at operation 516, e.g., for storage in memory 428. One reason for using L2 cache is that it is significantly larger than L1 and hence, can reserve space in its capacity while supporting standard, non-decompression logic/engine 102 related cacheline management operation(s). It can also potentially scale up DISA operation to support multiple decompressions happening concurrently in the decompression engine 102. However, embodiments are not limited to using L2 cache for these purposes and other cache levels (such as L1 and/or LLC) may be used depending on the implementation.

Furthermore, all the subsequent consumer loads 430 (e.g., in program order) that access the decompressed data region may be allocated in the OOO Scheduler 402 and Load Buffer (LB) 432, while the DISA-macro-store has not completed and is occupying an entry in the Store Buffer (SB) 412. The memory disambiguation logic (not shown) present in the core blocks these requests from being dispatched to uncore until the DISA-macro-store completes and writes back 428. This blocking happens because of the virtual address region overlapping detected by disambiguation between DISA-macro-store and these concerning loads 434. Other irrelevant/younger loads (which may not depend on decompressed data) will not be blocked and can proceed.

Moreover, the DISA-macro-store, when its sources are ready, updates its destination/writing virtual address region in the SB 412, which may be used by any memory-dependent younger load operations as mentioned above. Until a "ready" signal is received from the decompression logic/engine 102 (which has been given a connection to the SB), DISA-SB-entry continues to block younger loads. It then transfers the data to the L2 cache (as it is marked uncacheable in L1) and decompression logic/engine 102 identifies the DISA-related store request and sets its state variables (tracking DISA-SB-ID to segregate active DISAs) to initiate decompression. Using the decompressed size, it computes how many cachelines are required to write-back the decompressed data to and evicts (e.g., using LRU (Least Recently Used) algorithm) the required number of cachelines to reserve them exclusively for decompression logic/engine 102's output as discussed with reference to operations 510 and 512. L2 cache may also mark these as inaccessible by the core 408 and decompression logic/engine 102 may store the indices (e.g., sets/ways) of these cachelines mapping.

As decompression logic/engine 102 starts decompression, which may take multiple cycles depending on both the compression algorithm and the level of decompression used, it issues an acknowledgement signal to the SB 412 to unblock the waiting loads by bypassing them in the disambiguation logic using DISA SB ID as the exclusivity condition. So, younger consumer loads are unblocked to disambiguate and to be issued.

Further, the consumer loads that match a DISA SB may carry that SB ID with them or otherwise be associated with the SB ID. In an embodiment, these consumer loads are labelled as uncacheable loads in the L1 cache and do not look up the L1 cache, directly reaching the L2 cache. Decompression logic/engine 102 detects/catches these loads and supplies them the lookup way in the MLC (using the source load address and the decompressed address region to L2 reserved cacheline mapping that decompression logic/engine 102 records when it performs its reservation). The load then reads the decompressed data from MLC. If that cacheline is not written to yet, the load is blocked here and will only complete writeback when the decompression logic/engine 102 completes its process and writes back the data with a signal for the load to proceed to its corresponding cacheline. Eventually, decompression logic/engine 102 will complete its active DISA and by then, all loads will have received the required data and will writeback to their destination registers when sent back to the core. Decompression logic/engine 102 then sends a signal back finally to the corresponding SB ID and writes back its status as complete 428.

When DISA-macro-store becomes the head of the SB 412 and is able to retire after having written back, it becomes senior. It is finally dispatched to uncore 410 while its SB is deallocated. Decompression logic/engine 102 recognizes the senior status request of the store and un-reserves the reserved memory—making the corresponding cachelines "public for core" from "private for decompression logic/engine 102." For decompression operations that are performed speculatively, operation 518 determines whether the speculation was correct, and if so commits and makes the data visible in L2 cache; otherwise, the allocated scratchpad in L2 cache is released/invalidated. Moreover, the DE logic 102 also writes back 428 the final compressed data back to the memory by issuing (e.g., multiple) senior store(s) to the DRAM or main memory (such as memory 1060 of FIG. 10).

In an embodiment, once the DISA instruction is committed in the ROB 404, an atomic store is performed to write the data back and the allocated space in the L2 cache is released. This delayed writeback to memory is another optimization where the corresponding younger load(s) can directly obtain the decompressed data without having to go all the way to the core 408. It acts as a bypass at L2 for the concerned loads. In an embodiment, if there is an error during decompression, the scratchpad 424 will be discarded, and an OS fault may be issued to correct it. Additionally, while the load and store operations triggered by the DISA may appear as one atomic load and one atomic store, a series of load and store operations may be conducted as discussed above.

Performance Summary

Figure 6:
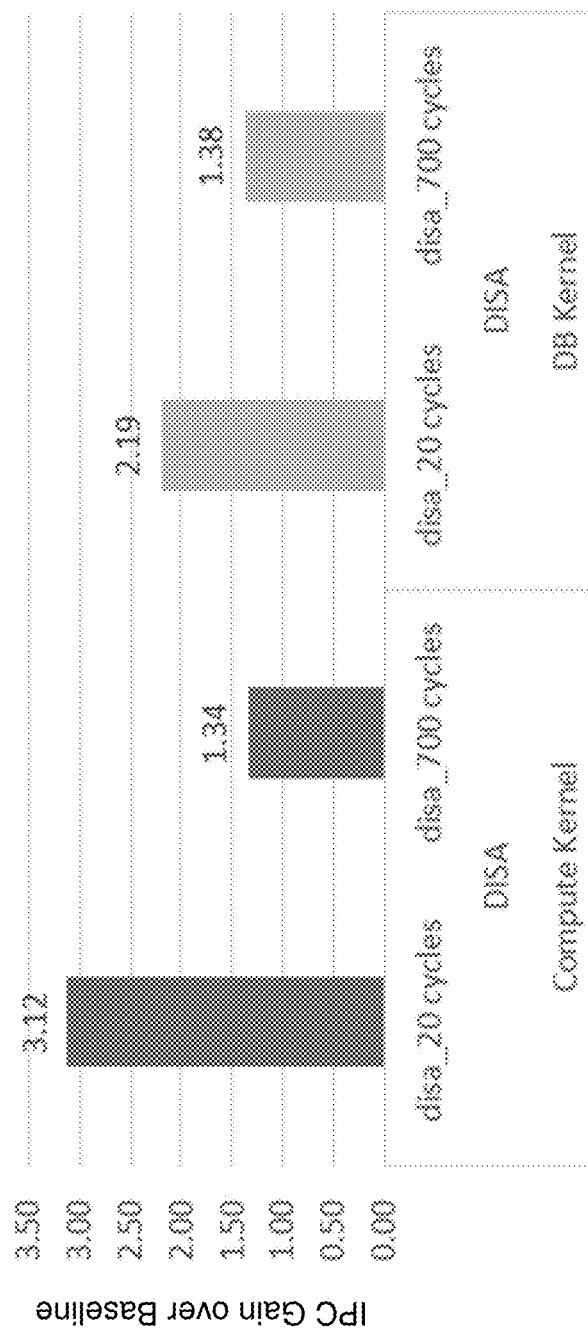
FIG. 6 shows sample evaluation results, according to an embodiment.

FIG. 6 shows sample evaluation results, according to an embodiment. The evaluation data shown in FIG. 6 was evaluated relative to a hypothetical next generation OOO architecture, e.g., in a constrained memory bandwidth scenario. Two kernels are traced for the analysis, one mimicking a sample database run on servers. The other was a proxy for a compute-bound kernel. As can be seen, a DISA engine sitting next to the MLC (20 cycles of communication latency) could potentially provide a significant boost to performance (over 2×IPC (Instructions Per Cycle) gain). Further, the performance of a similarly built decompression accelerator that sits much further away, e.g., on a mesh interconnect, has a much higher startup latency. Expectedly, the performance gains from such a distant accelerator is significantly muted. The results clearly demonstrate the potential advantages of reading compressed data over the interconnect and using low latency techniques to decompress it as disclosed by one or more embodiments.

Instruction Sets

An instruction set may include one or more instruction formats. A given instruction format may define various fields (e.g., number of bits, location of bits) to specify, among other things, the operation to be performed (e.g., opcode) and the operand(s) on which that operation is to be performed and/or other data field(s) (e.g., mask). Some instruction formats are further broken down though the definition of instruction templates (or subformats). For example, the instruction templates of a given instruction format may be defined to have different subsets of the instruction format's fields (the included fields are typically in the same order, but at least some have different bit positions because there are less fields included) and/or defined to have a given field interpreted differently. Thus, each instruction of an ISA is expressed using a given instruction format (and, if defined, in a given one of the instruction templates of that instruction format) and includes fields for specifying the operation and the operands. For example, an exemplary ADD instruction has a specific opcode and an instruction format that includes an opcode field to specify that opcode and operand fields to select operands (source1/destination and source2); and an occurrence of this ADD instruction in an instruction stream will have specific contents in the operand fields that select specific operands. A set of SIMD extensions referred to as the Advanced Vector Extensions (AVX) (AVX1 and AVX2) and using the Vector Extensions (VEX) coding scheme has been released and/or published (e.g., see Intel® 64 and IA-32 Architectures Software Developer's Manual, September 2014; and see Intel® Advanced Vector Extensions Programming Reference, October 2014).

Exemplary Instruction Formats

Embodiments of the instruction(s) described herein may be embodied in different formats. Additionally, exemplary systems, architectures, and pipelines are detailed below. Embodiments of the instruction(s) may be executed on such systems, architectures, and pipelines, but are not limited to those detailed.

While embodiments will be described in which the vector friendly instruction format supports the following: a 64 byte vector operand length (or size) with 32 bit (4 byte) or 64 bit (8 byte) data element widths (or sizes) (and thus, a 64 byte vector consists of either 16 doubleword-size elements or alternatively, 8 quadword-size elements); a 64 byte vector operand length (or size) with 16 bit (2 byte) or 8 bit (1 byte) data element widths (or sizes); a 32 byte vector operand length (or size) with 32 bit (4 byte), 64 bit (8 byte), 16 bit (2 byte), or 8 bit (1 byte) data element widths (or sizes); and a 16 byte vector operand length (or size) with 32 bit (4 byte), 64 bit (8 byte), 16 bit (2 byte), or 8 bit (1 byte) data element widths (or sizes); alternative embodiments may support more, less and/or different vector operand sizes (e.g., 256 byte vector operands) with more, less, or different data element widths (e.g., 128 bit (16 byte) data element widths).

FIG. 7A is a block diagram illustrating an exemplary instruction format according to embodiments. FIG. 7A shows an instruction format 700 that is specific in the sense that it specifies the location, size, interpretation, and order of the fields, as well as values for some of those fields. The instruction format 700 may be used to extend the x86 instruction set, and thus some of the fields are similar or the same as those used in the existing x86 instruction set and extension thereof (e.g., AVX). This format remains consistent with the prefix encoding field, real opcode byte field, MOD R/M field, SIB field, displacement field, and immediate fields of the existing x86 instruction set with extensions.

EVEX Prefix (Bytes 0-3) 702—is encoded in a four-byte form.

Format Field 782 (EVEX Byte 0, bits [7:0])—the first byte (EVEX Byte 0) is the format field 782 and it contains 0×62 (the unique value used for distinguishing the vector friendly instruction format in one embodiment).

The second-fourth bytes (EVEX Bytes 1-3) include a number of bit fields providing specific capability.

REX field 705 (EVEX Byte 1, bits [7-5])—consists of a EVEX.R bit field (EVEX Byte 1, bit [7]—R), EVEX.X bit field (EVEX byte 1, bit [6]—X), and 757BEX byte 1, bit [5]—B). The EVEX.R, EVEX.X, and EVEX.B bit fields provide the same functionality as the corresponding VEX bit fields, and are encoded using 1s complement form, i.e., ZMM0 is encoded as 1111B, ZMM15 is encoded as 0000B. Other fields of the instructions encode the lower three bits of the register indexes as is known in the art (rrr, xxx, and bbb), so that Rrrr, Xxxx, and Bbbb may be formed by adding EVEX.R, EVEX.X, and EVEX.B.

REX' field QAc10—this is the EVEX.R' bit field (EVEX Byte 1, bit [4]—R') that is used to encode either the upper 16 or lower 16 of the extended 32 register set. In one embodiment, this bit, along with others as indicated below, is stored in bit inverted format to distinguish (in the well-known x86 32-bit mode) from the BOUND instruction, whose real opcode byte is 62, but does not accept in the MOD R/M field (described below) the value of 11 in the MOD field; alternative embodiments do not store this and the other indicated bits below in the inverted format. A value of 1 is used to encode the lower 16 registers. In other words, R'Rrrr is formed by combining EVEX.R', EVEX.R, and the other RRR from other fields.

Opcode map field 715 (EVEX byte 1, bits [3:0]—mmmm)—its content encodes an implied leading opcode byte (0F, 0F 38, or 0F 3).

Data element width field 764 (EVEX byte 2, bit [7]—W)—is represented by the notation EVEX.W. EVEX.W is used to define the granularity (size) of the datatype (either 32-bit data elements or 64-bit data elements). This field is optional in the sense that it is not needed if only one data element width is supported and/or data element widths are supported using some aspect of the opcodes.

EVEX.vvvv 720 (EVEX Byte 2, bits [6:3]—vvvv)—the role of EVEX.vvvv may include the following: 1) EVEX.vvvv encodes the first source register operand, specified in inverted (1s complement) form and is valid for instructions with 2 or more source operands; 2) EVEX.vvvv encodes the destination register operand, specified in 1s complement form for certain vector shifts; or 3) EVEX.vvvv does not encode any operand, the field is reserved and should contain 1111b. Thus, EVEX.vvvv field 720 encodes the 4 low-order bits of the first source register specifier stored in inverted (1s complement) form. Depending on the instruction, an extra different EVEX bit field is used to extend the specifier size to 32 registers.

EVEX.U 768 Class field (EVEX byte 2, bit [2]—U)—If EVEX.U=0, it indicates class A (support merging-writemasking) or EVEX.U0; if EVEX.U=1, it indicates class B (support zeroing and merging-writemasking) or EVEX.U1.

Prefix encoding field 725 (EVEX byte 2, bits [1:0]—pp)—provides additional bits for the base operation field. In addition to providing support for the legacy SSE instructions in the EVEX prefix format, this also has the benefit of compacting the SIMD prefix (rather than requiring a byte to express the SIMD prefix, the EVEX prefix requires only 2 bits). In one embodiment, to support legacy SSE instructions that use a SIMD prefix (66H, F2H, F3H) in both the legacy format and in the EVEX prefix format, these legacy SIMD prefixes are encoded into the SIMD prefix encoding field; and at runtime are expanded into the legacy SIMD prefix prior to being provided to the decoder's PLA (so the PLA can execute both the legacy and EVEX format of these legacy instructions without modification). Although newer instructions could use the EVEX prefix encoding field's content directly as an opcode extension, certain embodiments expand in a similar fashion for consistency but allow for different meanings to be specified by these legacy SIMD prefixes. An alternative embodiment may redesign the PLA to support the 2 bit SIMD prefix encodings, and thus not require the expansion.

Alpha field 753 (EVEX byte 3, bit [7]—EH; also known as EVEX.EH, EVEX.rs, EVEX.RL, EVEX.writemask control, and EVEX.N; also illustrated with α)—its content distinguishes which one of the different augmentation operation types are to be performed.

Beta field 755 (EVEX byte 3, bits [6:4]—SSS, also known as EVEX.s2-0, EVEX.r2-0, EVEX.rr1, EVEX.LL0, EVEX.LLB; also illustrated with βββ)—distinguishes which of the operations of a specified type are to be performed.

REX' field 710—this is the remainder of the REX' field and is the EVEX.V' bit field (EVEX Byte 3, bit [3]—V') that may be used to encode either the upper 16 or lower 16 of the extended 32 register set. This bit is stored in bit inverted format. A value of 1 is used to encode the lower 16 registers. In other words, V'VVVV is formed by combining EVEX.V', EVEX.vvvv.

Writemask field 771 (EVEX byte 3, bits [2:0]—kkk)—its content specifies the index of a register in the writemask registers. In one embodiment, the specific value EVEX kkk=000 has a special behavior implying no writemask is used for the particular instruction (this may be implemented in a variety of ways including the use of a writemask hardwired to all ones or hardware that bypasses the masking hardware). When merging, vector masks allow any set of elements in the destination to be protected from updates during the execution of any operation (specified by the base operation and the augmentation operation); in other one embodiment, preserving the old value of each element of the destination where the corresponding mask bit has a 0. In contrast, when zeroing vector masks allow any set of elements in the destination to be zeroed during the execution of any operation (specified by the base operation and the augmentation operation); in one embodiment, an element of the destination is set to 0 when the corresponding mask bit has a 0 value. A subset of this functionality is the ability to control the vector length of the operation being performed (that is, the span of elements being modified, from the first to the last one); however, it is not necessary that the elements that are modified be consecutive. Thus, the writemask field 771 allows for partial vector operations, including loads, stores, arithmetic, logical, etc. While embodiments are described in which the writemask field's 771 content selects one of a number of writemask registers that contains the writemask to be used (and thus the writemask field's 771 content indirectly identifies that masking to be performed), alternative embodiments instead or additional allow the mask write field's 771 content to directly specify the masking to be performed.

Real Opcode Field 730 (Byte 4) is also known as the opcode byte. Part of the opcode is specified in this field.

MOD R/M Field 740 (Byte 5) includes MOD field 742, register index field 744, and R/M field 746. The MOD field's 742 content distinguishes between memory access and non-memory access operations. The role of register index field 744 can be summarized to two situations: encoding either the destination register operand or a source register operand, or be treated as an opcode extension and not used to encode any instruction operand. The content of register index field 744, directly or through address generation, specifies the locations of the source and destination operands, be they in registers or in memory. These include a sufficient number of bits to select N registers from a PxQ (e.g., 32×512, 16×128, 32×1024, 64×1024) register file. While in one embodiment N may be up to three sources and one destination register, alternative embodiments may support more or less sources and destination registers (e.g., may support up to two sources where one of these sources also acts as the destination, may support up to three sources where one of these sources also acts as the destination, may support up to two sources and one destination).

The role of R/M field 746 may include the following: encoding the instruction operand that references a memory address, or encoding either the destination register operand or a source register operand.

Scale, Index, Base (SIB) Byte (Byte 6)—The scale field's 750 content allows for the scaling of the index field's content for memory address generation (e.g., for address generation that uses 2scale*index+base). SIB.xxx 754 and SIB.bbb 756—the contents of these fields have been previously referred to with regard to the register indexes Xxxx and Bbbb.

Displacement field 763A (Bytes 7-10)—when MOD field 742 contains 10, bytes 7-10 are the displacement field 763A, and it works the same as the legacy 32-bit displacement (disp32) and works at byte granularity. This may be used as part of memory address generation (e.g., for address generation that uses 2scale*index+base+displacement).

Displacement factor field 763B (Byte 7)—when MOD field 742 contains 01, byte 7 is the displacement factor field 763B. The location of this field is that same as that of the legacy x86 instruction set 8-bit displacement (disp8), which works at byte granularity. Since disp8 is sign extended, it can only address between −128 and 127 bytes offsets; in terms of 64 byte cache lines, disp8 uses 8 bits that can be set to only four really useful values −128, −64, 0, and 64; since a greater range is often needed, disp32 is used; however, disp32 requires 4 bytes. In contrast to disp8 and disp32, the displacement factor field 763B is a reinterpretation of disp8; when using displacement factor field 763B, the actual displacement is determined by the content of the displacement factor field multiplied by the size of the memory operand access (N). This type of displacement is referred to as disp8*N. This reduces the average instruction length (a single byte of used for the displacement but with a much greater range). Such compressed displacement is based on the assumption that the effective displacement is multiple of the granularity of the memory access, and hence, the redundant low-order bits of the address offset do not need to be encoded. In other words, the displacement factor field 763B substitutes the legacy x86 instruction set 8-bit displacement. Thus, the displacement factor field 763B is encoded the same way as an x86 instruction set 8-bit displacement (so no changes in the ModRM/SIB encoding rules) with the only exception that disp8 is overloaded to disp8*N. In other words, there are no changes in the encoding rules or encoding lengths but only in the interpretation of the displacement value by hardware (which needs to scale the displacement by the size of the memory operand to obtain a byte-wise address offset).

Immediate field 772 allows for the specification of an immediate. This field is optional in the sense that is it not present in an implementation of the generic vector friendly format that does not support immediate and it is not present in instructions that do not use an immediate.

Full Opcode Field

FIG. 7B is a block diagram illustrating the fields of the instruction format 700 that make up the full opcode field 774 according to one embodiment. Specifically, the full opcode field 774 includes the format field 782, the base operation field 743, and the data element width (W) field 763. The base operation field 743 includes the prefix encoding field 725, the opcode map field 715, and the real opcode field 730.

Register Index Field

FIG. 7C is a block diagram illustrating the fields of the format 700 that make up the register index field 745 according to one embodiment. Specifically, the register index field 745 includes the REX field 705, the REX' field 710, the MODR/M.reg field 744, the MODR/M.r/m field 746, the VVVV field 720, xxx field 754, and the bbb field 756.

Augmentation Operation Field

Figure 7D:
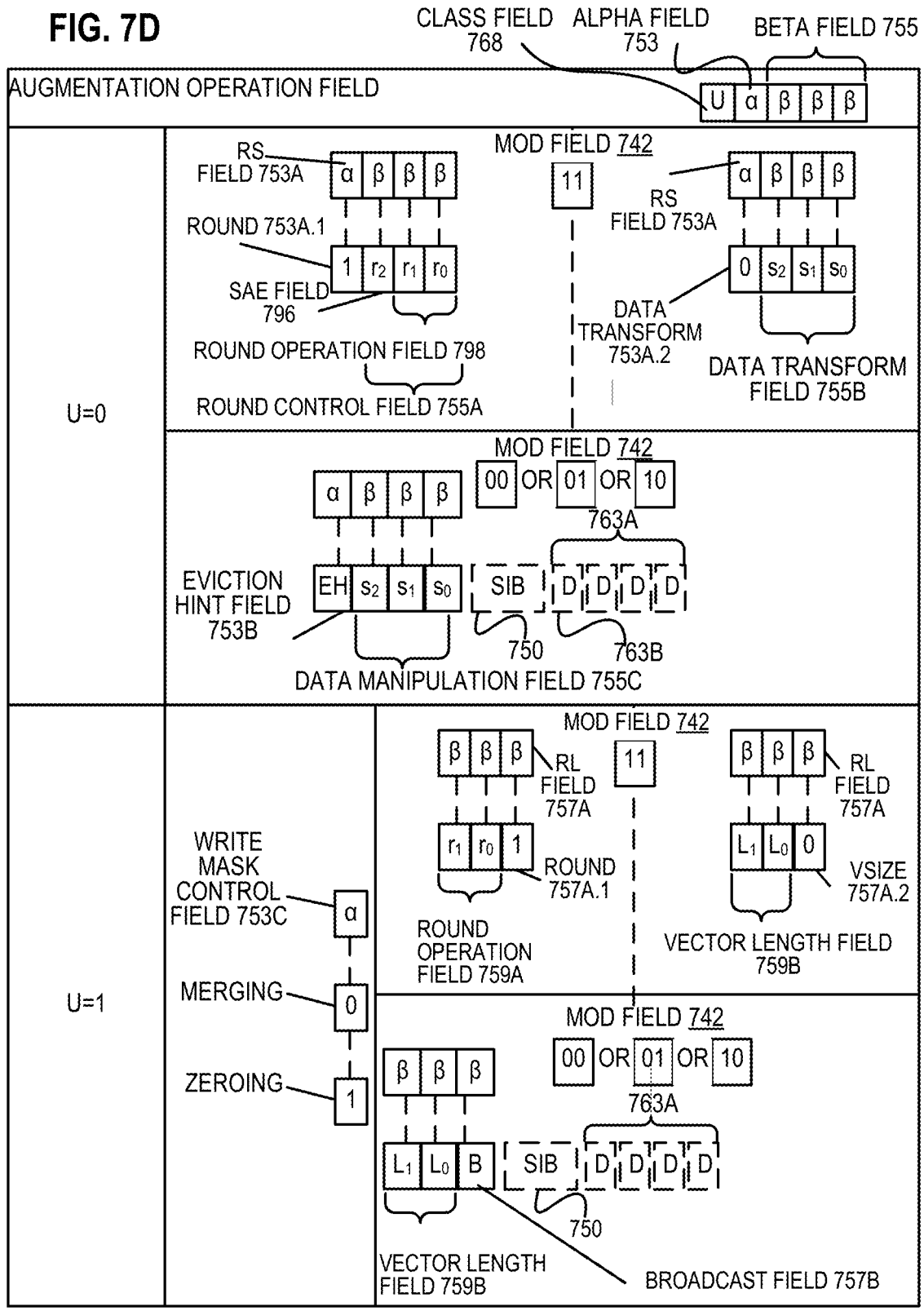
FIG. 7D is a block diagram illustrating the fields of the instruction format that make up the augmentation operation field according to one embodiment.

FIG. 7D is a block diagram illustrating the fields of the instruction format 700 that make up an augmentation operation field according to one embodiment. When the class (U) field 768 contains 0, it signifies EVEX.U0 (class A 768A); when it contains 1, it signifies EVEX.U1 (class B 768B).

When U=0 and the MOD field 742 contains 11 (signifying a no memory access operation), the alpha field 753 (EVEX byte 3, bit [7]—EH) is interpreted as the rs field 753A. When the rs field 753A contains a 1 (round 753A.1), the beta field 755 (EVEX byte 3, bits [6:4]—SSS) is interpreted as the round control field 755A. The round control field 755A includes a one bit SAE field 796 and a two bit round operation field 798. When the rs field 753A contains a 0 (data transform 753A.2), the beta field 755 (EVEX byte 3, bits [6:4]—SSS) is interpreted as a three bit data transform field 755B. When U=0 and the MOD field 742 contains 00, 01, or 10 (signifying a memory access operation), the alpha field 753 (EVEX byte 3, bit [7]—EH) is interpreted as the eviction hint (EH) field 753B and the beta field 755 (EVEX byte 3, bits [6:4]—SSS) is interpreted as a three bit data manipulation field 755C.

When U=1, the alpha field 753 (EVEX byte 3, bit [7]—EH) is interpreted as the writemask control (Z) field 753C. When U=1 and the MOD field 742 contains 11 (signifying a no memory access operation), part of the beta field 755 (EVEX byte 3, bit [4]—S0) is interpreted as the RL field 757A; when it contains a 1 (round 757A.1) the rest of the beta field 755 (EVEX byte 3, bit [6-5]—S2-1) is interpreted as the round operation field 759A, while when the RL field 757A contains a 0 (VSIZE 757.A2) the rest of the beta field 755 (EVEX byte 3, bit [6-5]—S2-1) is interpreted as the vector length field 759B (EVEX byte 3, bit [6-5]—L1-0). When U=1 and the MOD field 742 contains 00, 01, or 10 (signifying a memory access operation), the beta field 755 (EVEX byte 3, bits [6:4]—SSS) is interpreted as the vector length field 759B (EVEX byte 3, bit [6-5]—L1-0) and the broadcast field 757B (EVEX byte 3, bit [4]—B).

Exemplary Register Architecture

Figure 8:
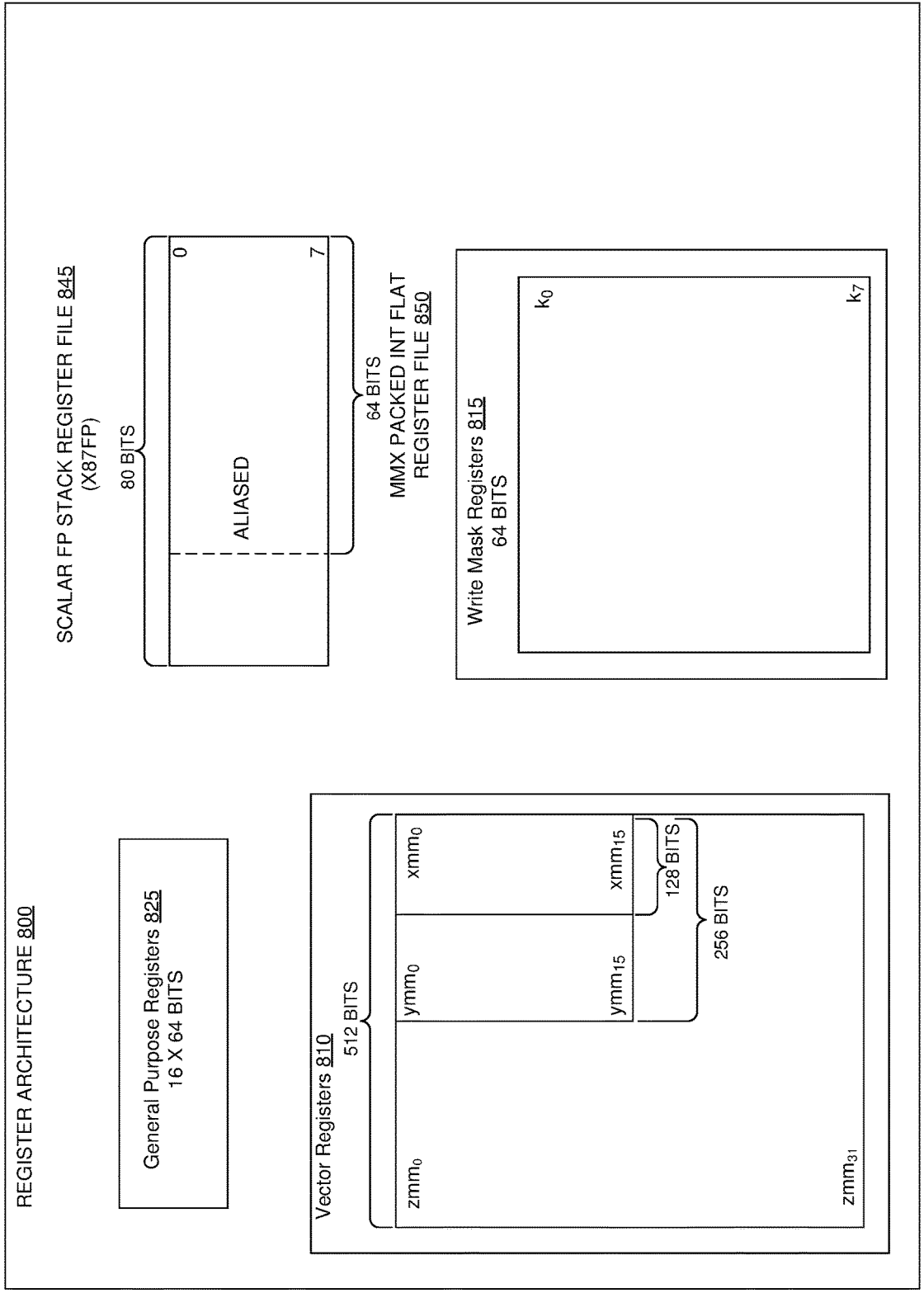
FIG. 8 is a block diagram of a register architecture according to one embodiment.

FIG. 8 is a block diagram of a register architecture 800 according to one embodiment. In the embodiment illustrated, there are 32 vector registers 810 that are 512 bits wide; these registers are referenced as ZMM0 through ZMM31. The lower order 256 bits of the lower 16 ZMM registers are overlaid on registers YMM0-16. The lower order 128 bits of the lower 16 ZMM registers (the lower order 128 bits of the YMM registers) are overlaid on registers XMM0-15. In other words, the vector length field 759B selects between a maximum length and one or more other shorter lengths, where each such shorter length is half the length of the preceding length; and instructions templates without the vector length field 759B operate on the maximum vector length. Further, in one embodiment, the class B instruction templates of the instruction format 700 operate on packed or scalar single/double-precision floating point data and packed or scalar integer data. Scalar operations are operations performed on the lowest order data element position in a ZMM/YMM/XMM register; the higher order data element positions are either left the same as they were prior to the instruction or zeroed depending on the embodiment.

Writemask registers 815—in the embodiment illustrated, there are 8 writemask registers (k0 through k7), each 64 bits in size. In an alternate embodiment, the writemask registers 815 are 16 bits in size. In some embodiments, the vector mask register k0 cannot be used as a writemask; when the encoding that would normally indicate k0 is used for a writemask, it selects a hardwired writemask of 0xFFFF, effectively disabling writemasking for that instruction.

General-purpose registers 825—in the embodiment illustrated, there are sixteen 64-bit general-purpose registers that are used along with the existing x86 addressing modes to address memory operands. These registers are referenced by the names RAX, RBX, RCX, RDX, RBP, RSI, RDI, RSP, and R8 through R15.

Scalar floating point stack register file (x87 stack) 845, on which is aliased the MMX packed integer flat register file 850—in the embodiment illustrated, the x87 stack is an eight-element stack used to perform scalar floating-point operations on 32/64/80-bit floating point data using the x87 instruction set extension; while the MMX registers are used to perform operations on 64-bit packed integer data, as well as to hold operands for some operations performed between the MMX and XMM registers.

Alternative embodiments may use wider or narrower registers. Additionally, alternative embodiments may use more, less, or different register files and registers.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU (Central Processing Unit) including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

FIG. 9A is a block diagram illustrating both an exemplary in-order pipeline and an exemplary register renaming, out-of-order issue/execution pipeline according to embodiments. FIG. 9B is a block diagram illustrating both an exemplary embodiment of an in-order architecture core and an exemplary register renaming, out-of-order issue/execution architecture core to be included in a processor according to embodiments. The solid lined boxes in FIGS. 9A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 9A, a processor pipeline 900 includes a fetch stage 902, a length decode stage 904, a decode stage 906, an allocation stage 908, a renaming stage 910, a scheduling (also known as a dispatch or issue) stage 912, a register read/memory read stage 914, an execute stage 916, a write back/memory write stage 918, an exception handling stage 922, and a commit stage 924.

FIG. 9B shows processor core 990 including a front end unit 930 coupled to an execution engine unit 950, and both are coupled to a memory unit 970. The core 990 may be a reduced instruction set computing (RISC) core, a complex instruction set computing (CISC) core, a very long instruction word (VLIW) core, or a hybrid or alternative core type. As yet another option, the core 990 may be a special-purpose core, such as, for example, a network or communication core, compression engine, coprocessor core, general purpose computing graphics processing unit (GPGPU) core, graphics core, or the like.

The front end unit 930 includes a branch prediction unit 932 coupled to an instruction cache unit 934, which is coupled to an instruction translation lookaside buffer (TLB) 936, which is coupled to an instruction fetch unit 938, which is coupled to a decode unit 940. The decode unit 940 (or decoder) may decode instructions, and generate as an output one or more micro-operations, micro-code entry points, microinstructions, other instructions, or other control signals, which are decoded from, or which otherwise reflect, or are derived from, the original instructions. The decode unit 940 may be implemented using various different mechanisms. Examples of suitable mechanisms include, but are not limited to, look-up tables, hardware implementations, programmable logic arrays (PLAs), microcode read only memories (ROMs), etc. In one embodiment, the core 990 includes a microcode ROM or other medium that stores microcode for certain macroinstructions (e.g., in decode unit 940 or otherwise within the front end unit 930). The decode unit 940 is coupled to a rename/allocator unit 952 in the execution engine unit 950.

The execution engine unit 950 includes the rename/allocator unit 952 coupled to a retirement unit 954 and a set of one or more scheduler unit(s) 956. The scheduler unit(s) 956 represents any number of different schedulers, including reservations stations, central instruction window, etc. The scheduler unit(s) 956 is coupled to the physical register file(s) unit(s) 958. Each of the physical register file(s) units 958 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 958 comprises a vector registers unit, a writemask registers unit, and a scalar registers unit. These register units may provide architectural vector registers, vector mask registers, and general purpose registers. The physical register file(s) unit(s) 958 is overlapped by the retirement unit 954 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 954 and the physical register file(s) unit(s) 958 are coupled to the execution cluster(s) 960. The execution cluster(s) 960 includes a set of one or more execution units 962 and a set of one or more memory access units 964. The execution units 962 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 956, physical register file(s) unit(s) 958, and execution cluster(s) 960 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 964). It should also be understood that where separate pipelines are used, one or more of these pipelines may be out-of-order issue/execution and the rest in-order.

The set of memory access units 964 is coupled to the memory unit 970, which includes a data TLB unit 972 coupled to a data cache unit 974 coupled to a level 2 (L2) cache unit 976. In one exemplary embodiment, the memory access units 964 may include a load unit, a store address unit, and a store data unit, each of which is coupled to the data TLB unit 972 in the memory unit 970. The instruction cache unit 934 is further coupled to a level 2 (L2) cache unit 976 in the memory unit 970. The L2 cache unit 976 is coupled to one or more other levels of cache and eventually to a main memory.

By way of example, the exemplary register renaming, out-of-order issue/execution core architecture may implement the pipeline 900 as follows: 1) the instruction fetch 938 performs the fetch and length decoding stages 902 and 904; 2) the decode unit 940 performs the decode stage 906; 3) the rename/allocator unit 952 performs the allocation stage 908 and renaming stage 910; 4) the scheduler unit(s) 956 performs the schedule stage 912; 5) the physical register file(s) unit(s) 958 and the memory unit 970 perform the register read/memory read stage 914; the execution cluster 960 perform the execute stage 916; 6) the memory unit 970 and the physical register file(s) unit(s) 958 perform the write back/memory write stage 918; 7) various units may be involved in the exception handling stage 922; and 8) the retirement unit 954 and the physical register file(s) unit(s) 958 perform the commit stage 924.

The core 990 may support one or more instructions sets (e.g., the x86 instruction set (with some extensions that have been added with newer versions); the MIPS instruction set of MIPS Technologies of Sunnyvale, CA; the ARM instruction set (with optional additional extensions such as NEON) of ARM Holdings of Sunnyvale, CA), including the instruction(s) described herein. In one embodiment, the core 990 includes logic to support a packed data instruction set extension (e.g., AVX1, AVX2), thereby allowing the operations used by many multimedia applications to be performed using packed data.

Figure 10:
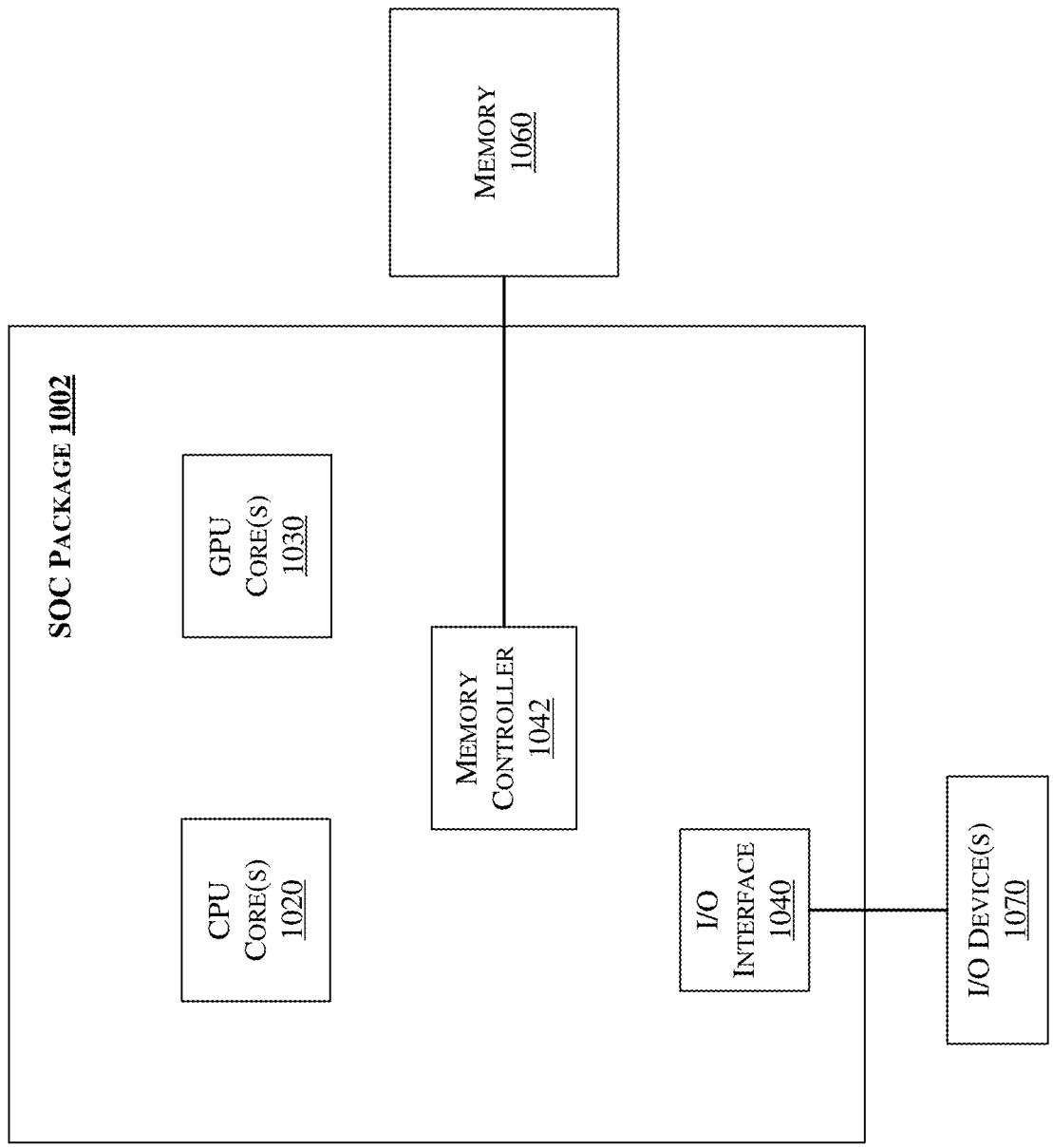
FIG. 10 illustrates a block diagram of an SOC (System On Chip) package in accordance with an embodiment.

FIG. 10 illustrates a block diagram of an SOC package in accordance with an embodiment. As illustrated in FIG. 10, SOC 1002 includes one or more Central Processing Unit (CPU) cores 1020, one or more Graphics Processor Unit (GPU) cores 1030, an Input/Output (I/O) interface 1040, and a memory controller 1042. Various components of the SOC package 1002 may be coupled to an interconnect or bus such as discussed herein with reference to the other figures. Also, the SOC package 1002 may include more or less components, such as those discussed herein with reference to the other figures. Further, each component of the SOC package 1002 may include one or more other components, e.g., as discussed with reference to the other figures herein. In one embodiment, SOC package 1002 (and its components) is provided on one or more Integrated Circuit (IC) die, e.g., which are packaged into a single semiconductor device.

As illustrated in FIG. 10, SOC package 1002 is coupled to a memory 1060 via the memory controller 1042. In an embodiment, the memory 1060 (or a portion of it) can be integrated on the SOC package 1002.

The I/O interface 1040 may be coupled to one or more I/O devices 1070, e.g., via an interconnect and/or bus such as discussed herein with reference to other figures. I/O device(s) 1070 may include one or more of a keyboard, a mouse, a touchpad, a display, an image/video capture device (such as a camera or camcorder/video recorder), a touch screen, a speaker, or the like.

Figure 11:
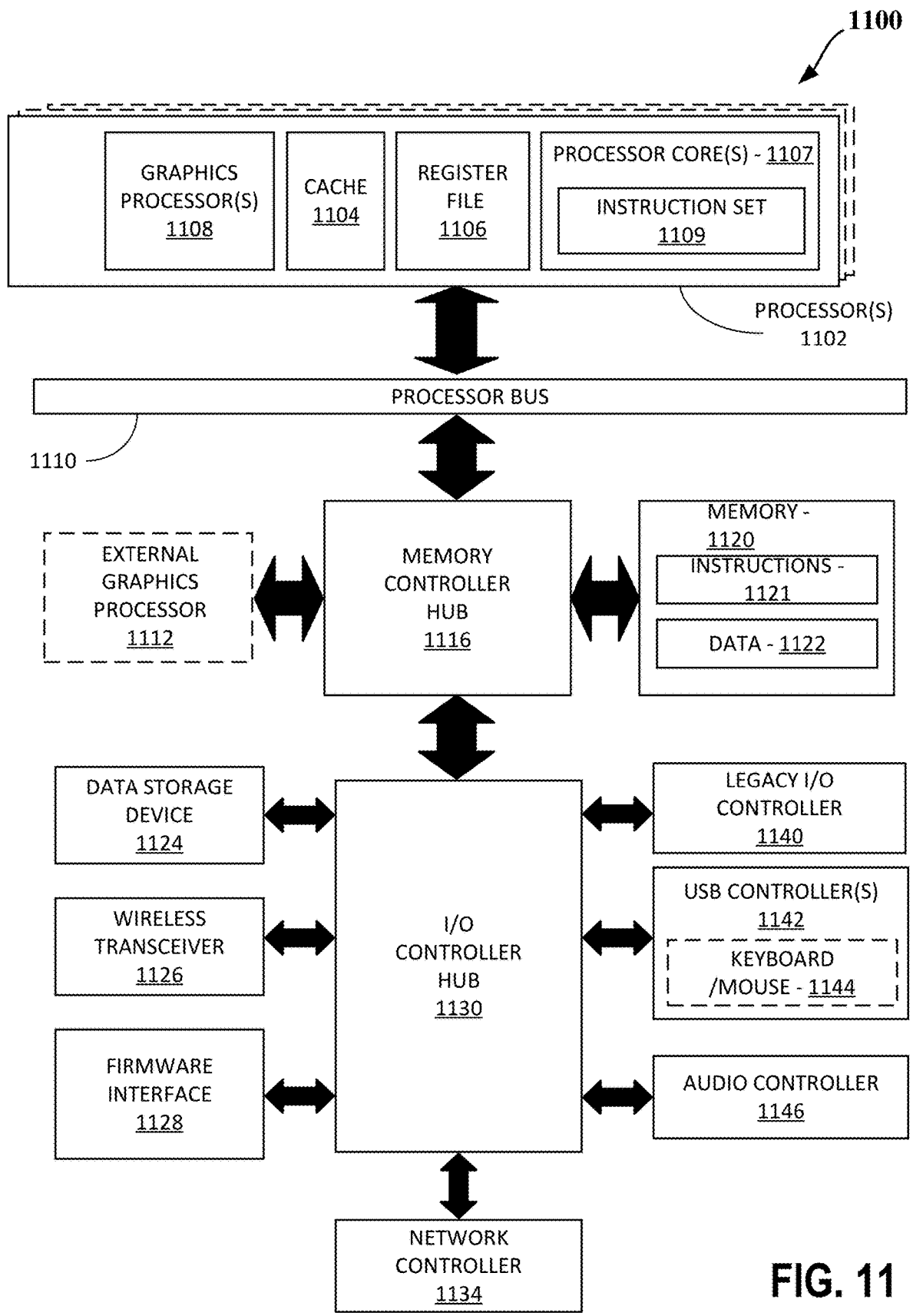
FIG. 11 is a block diagram of a processing system, according to an embodiment.

FIG. 11 is a block diagram of a processing system 1100, according to an embodiment. In various embodiments the system 1100 includes one or more processors 1102 and one or more graphics processors 1108, and may be a single processor desktop system, a multiprocessor workstation system, or a server system having a large number of processors 1102 or processor cores 1107. In on embodiment, the system 1100 is a processing platform incorporated within a system-on-a-chip (SoC or SOC) integrated circuit for use in mobile, handheld, or embedded devices.

An embodiment of system 1100 can include, or be incorporated within a server-based gaming platform, a game console, including a game and media console, a mobile gaming console, a handheld game console, or an online game console. In some embodiments system 1100 is a mobile phone, smart phone, tablet computing device or mobile Internet device. Data processing system 1100 can also include, couple with, or be integrated within a wearable device, such as a smart watch wearable device, smart eyewear device, augmented reality device, or virtual reality device. In some embodiments, data processing system 1100 is a television or set top box device having one or more processors 1102 and a graphical interface generated by one or more graphics processors 1108.

In some embodiments, the one or more processors 1102 each include one or more processor cores 1107 to process instructions which, when executed, perform operations for system and user software. In some embodiments, each of the one or more processor cores 1107 is configured to process a specific instruction set 1109. In some embodiments, instruction set 1109 may facilitate Complex Instruction Set Computing (CISC), Reduced Instruction Set Computing (RISC), or computing via a Very Long Instruction Word (VLIW). Multiple processor cores 1107 may each process a different instruction set 1109, which may include instructions to facilitate the emulation of other instruction sets. Processor core 1107 may also include other processing devices, such a Digital Signal Processor (DSP).

In some embodiments, the processor 1102 includes cache memory 1104. Depending on the architecture, the processor 1102 can have a single internal cache or multiple levels of internal cache. In some embodiments, the cache memory is shared among various components of the processor 1102. In some embodiments, the processor 1102 also uses an external cache (e.g., a Level-3 (L3) cache or Last Level Cache (LLC)) (not shown), which may be shared among processor cores 1107 using known cache coherency techniques. A register file 1106 is additionally included in processor 1102 which may include different types of registers for storing different types of data (e.g., integer registers, floating point registers, status registers, and an instruction pointer register). Some registers may be general-purpose registers, while other registers may be specific to the design of the processor 1102.

In some embodiments, processor 1102 is coupled to a processor bus 1110 to transmit communication signals such as address, data, or control signals between processor 1102 and other components in system 1100. In one embodiment the system 1100 uses an exemplary 'hub' system architecture, including a memory controller hub 1116 and an Input Output (I/O) controller hub 1130. A memory controller hub 1116 facilitates communication between a memory device and other components of system 1100, while an I/O Controller Hub (ICH) 1130 provides connections to I/O devices via a local I/O bus. In one embodiment, the logic of the memory controller hub 1116 is integrated within the processor.

Memory device 1120 can be a dynamic random access memory (DRAM) device, a static random access memory (SRAM) device, flash memory device, phase-change memory device, or some other memory device having suitable performance to serve as process memory. In one embodiment the memory device 1120 can operate as system memory for the system 1100, to store data 1122 and instructions 1121 for use when the one or more processors 1102 executes an application or process. Memory controller hub 1116 also couples with an optional external graphics processor 1112, which may communicate with the one or more graphics processors 1108 in processors 1102 to perform graphics and media operations.

In some embodiments, ICH 1130 enables peripherals to connect to memory device 1120 and processor 1102 via a high-speed I/O bus. The I/O peripherals include, but are not limited to, an audio controller 1146, a firmware interface 1128, a wireless transceiver 1126 (e.g., Wi-Fi, Bluetooth), a data storage device 1124 (e.g., hard disk drive, flash memory, etc.), and a legacy I/O controller 1140 for coupling legacy (e.g., Personal System 2 (PS/2)) devices to the system. One or more Universal Serial Bus (USB) controllers 1142 connect input devices, such as keyboard and mouse 1144 combinations. A network controller 1134 may also couple to ICH 1130. In some embodiments, a high-performance network controller (not shown) couples to processor bus 1110. It will be appreciated that the system 1100 shown is exemplary and not limiting, as other types of data processing systems that are differently configured may also be used. For example, the I/O controller hub 1130 may be integrated within the one or more processor 1102, or the memory controller hub 1116 and I/O controller hub 1130 may be integrated into a discreet external graphics processor, such as the external graphics processor 1112.

Figure 12:
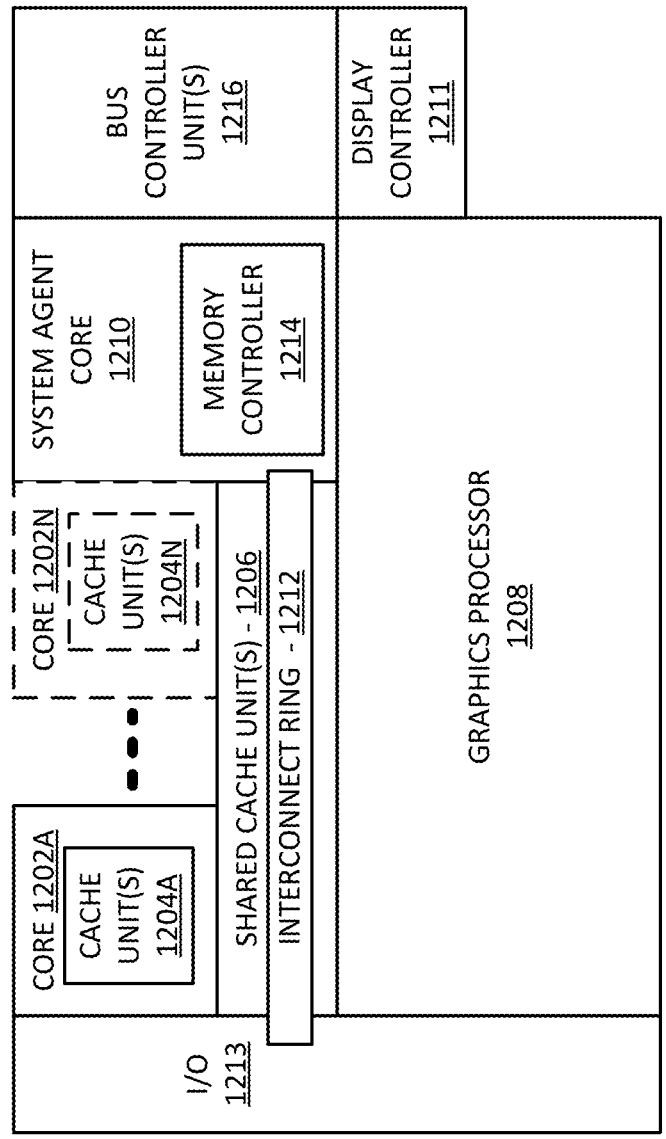
FIG. 12 is a block diagram of an embodiment of a processor having one or more processor cores, according to some embodiments.

FIG. 12 is a block diagram of an embodiment of a processor 1200 having one or more processor cores 1202A to 1202N, an integrated memory controller 1214, and an integrated graphics processor 1208. Those elements of FIG. 12 having the same reference numbers (or names) as the elements of any other figure herein can operate or function in any manner similar to that described elsewhere herein, but are not limited to such. Processor 1200 can include additional cores up to and including additional core 1202N represented by the dashed lined boxes. Each of processor cores 1202A to 1202N includes one or more internal cache units 1204A to 1204N. In some embodiments each processor core also has access to one or more shared cached units 1206.

The internal cache units 1204A to 1204N and shared cache units 1206 represent a cache memory hierarchy within the processor 1200. The cache memory hierarchy may include at least one level of instruction and data cache within each processor core and one or more levels of shared mid-level cache, such as a Level 2 (L2), Level 3 (L3), Level 4 (L4), or other levels of cache, where the highest level of cache before external memory is classified as the LLC. In some embodiments, cache coherency logic maintains coherency between the various cache units 1206 and 1204A to 1204N.

In some embodiments, processor 1200 may also include a set of one or more bus controller units 1216 and a system agent core 1210. The one or more bus controller units 1216 manage a set of peripheral buses, such as one or more Peripheral Component Interconnect buses (e.g., PCI, PCI Express). System agent core 1210 provides management functionality for the various processor components. In some embodiments, system agent core 1210 includes one or more integrated memory controllers 1214 to manage access to various external memory devices (not shown).

In some embodiments, one or more of the processor cores 1202A to 1202N include support for simultaneous multi-threading. In such embodiment, the system agent core 1210 includes components for coordinating and operating cores 1202A to 1202N during multi-threaded processing. System agent core 1210 may additionally include a power control unit (PCU), which includes logic and components to regulate the power state of processor cores 1202A to 1202N and graphics processor 1208.

In some embodiments, processor 1200 additionally includes graphics processor 1208 to execute graphics processing operations. In some embodiments, the graphics processor 1208 couples with the set of shared cache units 1206, and the system agent core 1210, including the one or more integrated memory controllers 1214. In some embodiments, a display controller 1211 is coupled with the graphics processor 1208 to drive graphics processor output to one or more coupled displays. In some embodiments, display controller 1211 may be a separate module coupled with the graphics processor via at least one interconnect, or may be integrated within the graphics processor 1208 or system agent core 1210.

In some embodiments, a ring based interconnect unit 1212 is used to couple the internal components of the processor 1200. However, an alternative interconnect unit may be used, such as a point-to-point interconnect, a switched interconnect, or other techniques, including techniques well known in the art. In some embodiments, graphics processor 1208 couples with the ring interconnect 1212 via an I/O link 1213.

The exemplary I/O link 1213 represents at least one of multiple varieties of I/O interconnects, including an on package I/O interconnect which facilitates communication between various processor components and a high-performance embedded memory module 1218, such as an eDRAM (or embedded DRAM) module. In some embodiments, each of the processor cores 1202 to 1202N and graphics processor 1208 use embedded memory modules 1218 as a shared Last Level Cache.

In some embodiments, processor cores 1202A to 1202N are homogenous cores executing the same instruction set architecture. In another embodiment, processor cores 1202A to 1202N are heterogeneous in terms of instruction set architecture (ISA), where one or more of processor cores 1202A to 1202N execute a first instruction set, while at least one of the other cores executes a subset of the first instruction set or a different instruction set. In one embodiment processor cores 1202A to 1202N are heterogeneous in terms of microarchitecture, where one or more cores having a relatively higher power consumption couple with one or more power cores having a lower power consumption. Additionally, processor 1200 can be implemented on one or more chips or as an SoC integrated circuit having the illustrated components, in addition to other components.

Figure 13:
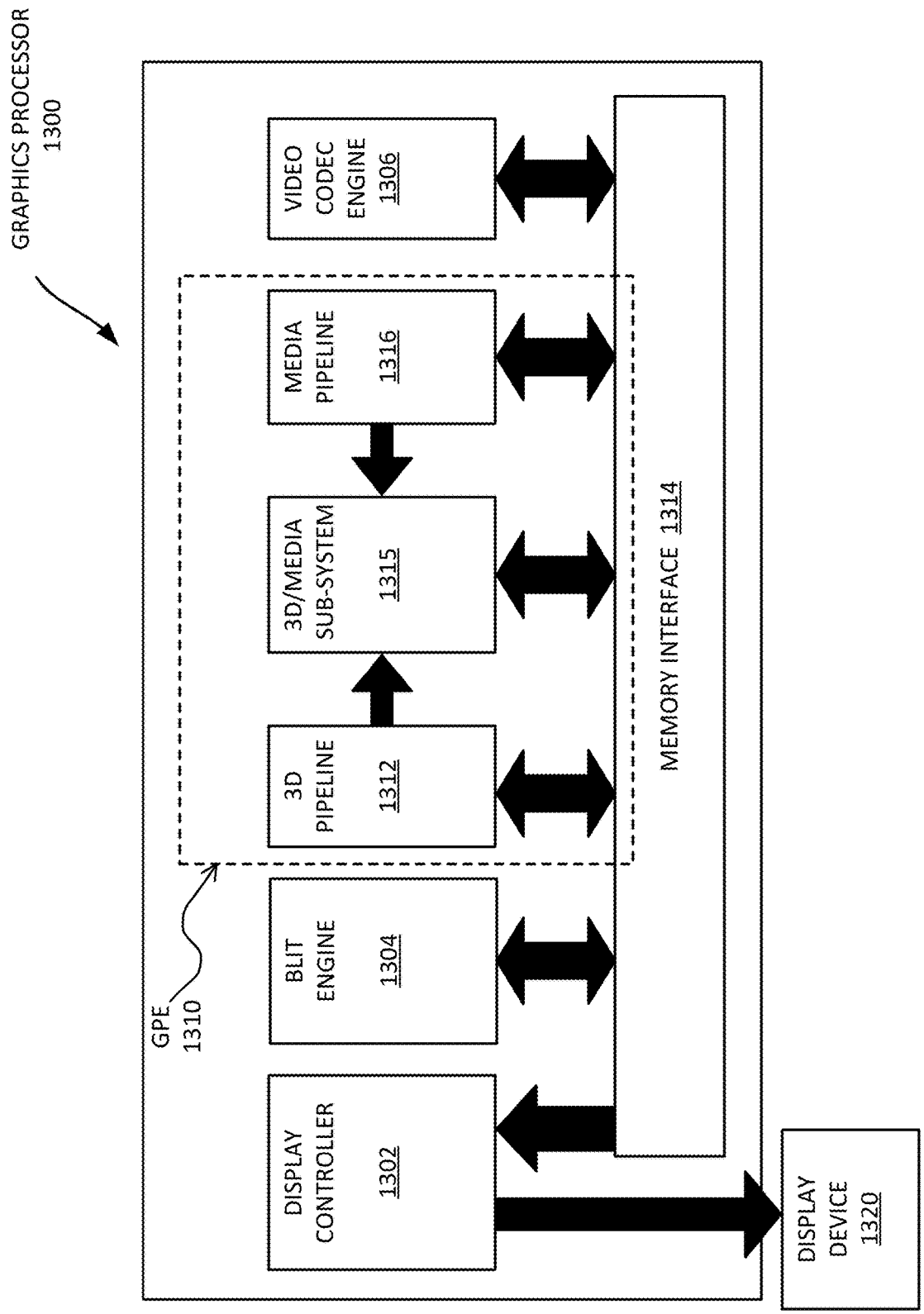
FIG. 13 is a block diagram of a graphics processor, according to an embodiment.

FIG. 13 is a block diagram of a graphics processor 1300, which may be a discrete graphics processing unit, or may be a graphics processor integrated with a plurality of processing cores. In some embodiments, the graphics processor communicates via a memory mapped I/O interface to registers on the graphics processor and with commands placed into the processor memory. In some embodiments, graphics processor 1300 includes a memory interface 1314 to access memory. Memory interface 1314 can be an interface to local memory, one or more internal caches, one or more shared external caches, and/or to system memory.

In some embodiments, graphics processor 1300 also includes a display controller 1302 to drive display output data to a display device 1320. Display controller 1302 includes hardware for one or more overlay planes for the display and composition of multiple layers of video or user interface elements. In some embodiments, graphics processor 1300 includes a video codec engine 1306 to encode, decode, or transcode media to, from, or between one or more media encoding formats, including, but not limited to Moving Picture Experts Group (MPEG) formats such as MPEG-2, Advanced Video Coding (AVC) formats such as H.264/MPEG-4 AVC, as well as the Society of Motion Picture & Television Engineers (SMPTE) 321M/VC-1, and Joint Photographic Experts Group (JPEG) formats such as JPEG, and Motion JPEG (MJPEG) formats.

In some embodiments, graphics processor 1300 includes a block image transfer (BLIT) engine 1304 to perform two-dimensional (2D) rasterizer operations including, for example, bit-boundary block transfers. However, in one embodiment, 3D graphics operations are performed using one or more components of graphics processing engine (GPE) 1310. In some embodiments, graphics processing engine 1310 is a compute engine for performing graphics operations, including three-dimensional (3D) graphics operations and media operations.

In some embodiments, GPE 1310 includes a 3D pipeline 1312 for performing 3D operations, such as rendering three-dimensional images and scenes using processing functions that act upon 3D primitive shapes (e.g., rectangle, triangle, etc.). The 3D pipeline 1312 includes programmable and fixed function elements that perform various tasks within the element and/or spawn execution threads to a 3D/Media sub-system 1315. While 3D pipeline 1312 can be used to perform media operations, an embodiment of GPE 1310 also includes a media pipeline 1316 that is specifically used to perform media operations, such as video post-processing and image enhancement.

In some embodiments, media pipeline 1316 includes fixed function or programmable logic units to perform one or more specialized media operations, such as video decode acceleration, video de-interlacing, and video encode acceleration in place of, or on behalf of video codec engine 1306. In some embodiments, media pipeline 1316 additionally includes a thread spawning unit to spawn threads for execution on 3D/Media sub-system 1315. The spawned threads perform computations for the media operations on one or more graphics execution units included in 3D/Media sub-system 1315.

In some embodiments, 3D/Media subsystem 1315 includes logic for executing threads spawned by 3D pipeline 1312 and media pipeline 1316. In one embodiment, the pipelines send thread execution requests to 3D/Media sub-system 1315, which includes thread dispatch logic for arbitrating and dispatching the various requests to available thread execution resources. The execution resources include an array of graphics execution units to process the 3D and media threads. In some embodiments, 3D/Media subsystem 1315 includes one or more internal caches for thread instructions and data. In some embodiments, the subsystem also includes shared memory, including registers and addressable memory, to share data between threads and to store output data.

In the following description, numerous specific details are set forth to provide a more thorough understanding. However, it will be apparent to one of skill in the art that the embodiments described herein may be practiced without one or more of these specific details. In other instances, well-known features have not been described to avoid obscuring the details of the present embodiments.

The following examples pertain to further embodiments. Example 1 includes an apparatus comprising: memory to store a decompression Application Programming Interface (API), the decompression API to receive an input handle to a data object, wherein the data object includes compressed data and metadata; and Decompression Engine (DE) circuitry to decompress the compressed data to generate uncompressed data, the DE circuitry to decompress the compressed data in response to invocation of a decompression instruction by the decompression API, wherein the metadata comprises a first operand to indicate a location of the compressed data, a second operand to indicate a size of the compressed data, a third operand to indicate a location to which decompressed data by the DE circuitry is to be stored, and a fourth operand to indicate a size of the decompressed data. Example 2 includes the apparatus of example 1, wherein a compression API is to provide the second operand. Example 3 includes the apparatus of example 2, wherein the memory is to store the compression API. Example 4 includes the apparatus of example 1, wherein a compression API is to compress input data to generate the compressed data. Example 5 includes the apparatus of example 4, wherein the compression API is to compress the input data in accordance with a deflate function. Example 6 includes the apparatus of example 4, wherein the compression API is to insert the compressed data and the metadata into the data object. Example 7 includes the apparatus of example 1, wherein the DE circuitry is to decompress the compressed data in accordance with the metadata. Example 8 includes the apparatus of example 1, wherein the decompression instruction is to cause the DE circuitry to perform an out-of-order decompression of the plurality of cachelines. Example 9 includes the apparatus of example 1, wherein the DE circuitry is to inform a processor core after decompression of each one of one or more cachelines, wherein the one or more cachelines are to store the compressed data and/or the decompressed data. Example 10 includes the apparatus of example 9, wherein the DE circuitry is to inform the processor core via a dedicated signal, modification to a status bit in a register, or modification of a status bit in a cache coupled to the processor core. Example 11 includes the apparatus of example 1, wherein one or more of the first operand and the third operand comprise a virtual memory address. Example 12 includes the apparatus of example 1, wherein a processor core, the DE circuitry, and the memory are on a single integrated circuit die. Example 13 includes the apparatus of example 12, wherein the processor core comprises a Graphics Processing Unit (GPU) core.

Example 14 includes one or more non-transitory computer-readable media comprising one or more instructions that when executed on at least one processor configure the at least one processor to perform one or more operations to: cause a decompression Application Programming Interface (API) to receive an input handle to a data object, wherein the data object includes compressed data and metadata; and cause Decompression Engine (DE) circuitry to decompress the compressed data to generate uncompressed data, the DE circuitry to decompress the compressed data in response to invocation of a decompression instruction by the decompression API, wherein the metadata comprises a first operand to indicate a location of the compressed data, a second operand to indicate a size of the compressed data, a third operand to indicate a location to which decompressed data by the DE circuitry is to be stored, and a fourth operand to indicate a size of the decompressed data. Example 15 includes the one or more computer-readable media of example 14, further comprising one or more instructions that when executed on the at least one processor configure the at least one processor to perform one or more operations to cause a compression API to provide the second operand. Example 16 includes the one or more computer-readable media of example 15, further comprising one or more instructions that when executed on the at least one processor configure the at least one processor to perform one or more operations to cause storage of the compression API in memory. Example 17 includes the one or more computer-readable media of example 14, further comprising one or more instructions that when executed on the at least one processor configure the at least one processor to perform one or more operations to cause a compression API to compress input data to generate the compressed data. Example 18 includes the one or more computer-readable media of example 17, further comprising one or more instructions that when executed on the at least one processor configure the at least one processor to perform one or more operations to cause the compression API to compress the input data in accordance with a deflate function. Example 19 includes the one or more computer-readable media of example 17, further comprising one or more instructions that when executed on the at least one processor configure the at least one processor to perform one or more operations to cause the compression API to insert the compressed data and the metadata into the data object. Example 20 includes the one or more computer-readable media of example 14, further comprising one or more instructions that when executed on the at least one processor configure the at least one processor to perform one or more operations to cause the DE circuitry to decompress the compressed data in accordance with the metadata. Example 21 includes the one or more computer-readable media of example 14, further comprising one or more instructions that when executed on the at least one processor configure the at least one processor to perform one or more operations to cause the DE circuitry to perform an out-of-order decompression of the plurality of cachelines. Example 22 includes the one or more computer-readable media of example 14, further comprising one or more instructions that when executed on the at least one processor configure the at least one processor to perform one or more operations to cause the DE circuitry to inform a processor core after decompression of each one of one or more cachelines, wherein the one or more cachelines are to store the compressed data and/or the decompressed data. Example 23 includes the one or more computer-readable media of example 22, further comprising one or more instructions that when executed on the at least one processor configure the at least one processor to perform one or more operations to cause the DE circuitry to inform the processor core via a dedicated signal, modification to a status bit in a register, or modification of a status bit in a cache coupled to the processor core. Example 24 includes the one or more computer-readable media of example 14, wherein one or more of the first operand and the third operand comprise a virtual memory address.

Example 25 includes an apparatus comprising means to perform a method as set forth in any preceding example. Example 26 includes machine-readable storage including machine-readable instructions, when executed, to implement a method or realize an apparatus as set forth in any preceding example.

In various embodiments, one or more operations discussed with reference to FIG. 1 et seq. may be performed by one or more components (interchangeably referred to herein as "logic") discussed with reference to any of the figures.

In various embodiments, the operations discussed herein, e.g., with reference to FIG. 1 et seq., may be implemented as hardware (e.g., logic circuitry), software, firmware, or combinations thereof, which may be provided as a computer program product, e.g., including one or more tangible (e.g., non-transitory) machine-readable or computer-readable media having stored thereon instructions (or software procedures) used to program a computer to perform a process discussed herein. The machine-readable medium may include a storage device such as those discussed with respect to the figures.

Additionally, such computer-readable media may be downloaded as a computer program product, wherein the program may be transferred from a remote computer (e.g., a server) to a requesting computer (e.g., a client) by way of data signals provided in a carrier wave or other propagation medium via a communication link (e.g., a bus, a modem, or a network connection).

Reference in the specification to "one embodiment" or "an embodiment" means that a particular feature, structure, and/or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. An apparatus comprising:
    memory to store a decompression Application Programming Interface (API), the decompression API to receive an input handle to a data object, wherein the data object includes compressed data and metadata; and
    Decompression Engine (DE) circuitry to decompress the compressed data to generate uncompressed data, the DE circuitry to decompress the compressed data in response to invocation of a decompression instruction by the decompression API,
    wherein the metadata comprises a first operand to indicate a location of the compressed data, a second operand to indicate a size of the compressed data, a third operand to indicate a location to which decompressed data by the DE circuitry is to be stored, and a fourth operand to indicate a size of the decompressed data.

2. The apparatus of claim 1, wherein a compression API is to provide the second operand.

3. The apparatus of claim 2, wherein the memory is to store the compression API.

4. The apparatus of claim 1, wherein a compression API is to compress input data to generate the compressed data.

5. The apparatus of claim 4, wherein the compression API is to compress the input data in accordance with a deflate function.

6. The apparatus of claim 4, wherein the compression API is to insert the compressed data and the metadata into the data object.

7. The apparatus of claim 1, wherein the DE circuitry is to decompress the compressed data in accordance with the metadata.

8. The apparatus of claim 1, wherein the decompression instruction is to cause the DE circuitry to perform an out-of-order decompression of the plurality of cachelines.

9. The apparatus of claim 1, wherein the DE circuitry is to inform a processor core after decompression of each one of one or more cachelines, wherein the one or more cachelines are to store the compressed data and/or the decompressed data.

10. The apparatus of claim 9, wherein the DE circuitry is to inform the processor core via a dedicated signal, modification to a status bit in a register, or modification of a status bit in a cache coupled to the processor core.

11. The apparatus of claim 1, wherein one or more of the first operand and the third operand comprise a virtual memory address.

12. The apparatus of claim 1, wherein a processor core, the DE circuitry, and the memory are on a single integrated circuit die.

13. The apparatus of claim 12, wherein the processor core comprises a Graphics Processing Unit (GPU) core.

14. One or more non-transitory computer-readable media comprising one or more instructions that when executed on at least one processor configure the at least one processor to perform one or more operations to:
    cause a decompression Application Programming Interface (API) to receive an input handle to a data object, wherein the data object includes compressed data and metadata; and
    cause Decompression Engine (DE) circuitry to decompress the compressed data to generate uncompressed data, the DE circuitry to decompress the compressed data in response to invocation of a decompression instruction by the decompression API,
    wherein the metadata comprises a first operand to indicate a location of the compressed data, a second operand to indicate a size of the compressed data, a third operand to indicate a location to which decompressed data by the DE circuitry is to be stored, and a fourth operand to indicate a size of the decompressed data.

15. The one or more computer-readable media of claim 14, further comprising one or more instructions that when executed on the at least one processor configure the at least one processor to perform one or more operations to cause a compression API to provide the second operand.

16. The one or more computer-readable media of claim 15, further comprising one or more instructions that when executed on the at least one processor configure the at least one processor to perform one or more operations to cause storage of the compression API in memory.

17. The one or more computer-readable media of claim 14, further comprising one or more instructions that when executed on the at least one processor configure the at least one processor to perform one or more operations to cause a compression API to compress input data to generate the compressed data.

18. The one or more computer-readable media of claim 17, further comprising one or more instructions that when executed on the at least one processor configure the at least one processor to perform one or more operations to cause the compression API to compress the input data in accordance with a deflate function.

19. The one or more computer-readable media of claim 17, further comprising one or more instructions that when executed on the at least one processor configure the at least one processor to perform one or more operations to cause the compression API to insert the compressed data and the metadata into the data object.

20. The one or more computer-readable media of claim 14, further comprising one or more instructions that when executed on the at least one processor configure the at least one processor to perform one or more operations to cause the DE circuitry to decompress the compressed data in accordance with the metadata.

21. The one or more computer-readable media of claim 14, further comprising one or more instructions that when executed on the at least one processor configure the at least one processor to perform one or more operations to cause the DE circuitry to perform an out-of-order decompression of the plurality of cachelines.

22. The one or more computer-readable media of claim 14, further comprising one or more instructions that when executed on the at least one processor configure the at least one processor to perform one or more operations to cause the DE circuitry to inform a processor core after decompression of each one of one or more cachelines, wherein the one or more cachelines are to store the compressed data and/or the decompressed data.

23. The one or more computer-readable media of claim 22, further comprising one or more instructions that when executed on the at least one processor configure the at least one processor to perform one or more operations to cause the DE circuitry to inform the processor core via a dedicated signal, modification to a status bit in a register, or modification of a status bit in a cache coupled to the processor core.

24. The one or more computer-readable media of claim 14, wherein one or more of the first operand and the third operand comprise a virtual memory address.

* * * * *